(12) United States Patent
Lee et al.

(10) Patent No.: US 10,890,995 B2
(45) Date of Patent: Jan. 12, 2021

(54) TOUCH DISPLAY DEVICE AND DISPLAY PANEL WITH REDUCED SIGNAL NOISE

(71) Applicant: LG DISPLAY CO., LTD., Seoul (KR)

(72) Inventors: JaeGyun Lee, Paju-si (KR); Sangkyu Kim, Goyan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 57 days.

(21) Appl. No.: 16/172,422

(22) Filed: Oct. 26, 2018

(65) Prior Publication Data

US 2019/0129551 A1 May 2, 2019

(30) Foreign Application Priority Data

Oct. 27, 2017 (KR) .......................... 10-2017-0141531

(51) Int. Cl.
*G06F 3/041* (2006.01)
*G09G 3/3208* (2016.01)
*H01L 27/32* (2006.01)
*G06F 3/044* (2006.01)

(52) U.S. Cl.
CPC ............ *G06F 3/0412* (2013.01); *G06F 3/044* (2013.01); *G09G 3/3208* (2013.01); *H01L 27/323* (2013.01); *H01L 27/3276* (2013.01); *G09G 2300/0426* (2013.01)

(58) Field of Classification Search
CPC .................. G06F 3/0412; G06F 3/044; G06F 2203/04111; G09G 3/32–3291; G09G 2300/0426; G09G 2310/0281; H01L 27/32–3297
See application file for complete search history.

(56) References Cited

U.S. PATENT DOCUMENTS

| | | | | |
|---|---|---|---|---|
| 10,347,853 | B2 * | 7/2019 | Park | G06F 3/0412 |
| 10,431,136 | B2 * | 10/2019 | Zhou | G02F 1/13452 |
| 10,474,295 | B2 * | 11/2019 | Kim | G06F 3/0445 |
| 10,475,862 | B2 * | 11/2019 | Jeong | H01L 51/5256 |
| 10,541,279 | B2 * | 1/2020 | An | G06F 3/0443 |
| 2014/0253499 | A1 * | 9/2014 | Lee | G06F 3/044 345/174 |
| 2018/0032188 | A1 * | 2/2018 | Park | G06F 3/0412 |
| 2018/0033830 | A1 * | 2/2018 | Kim | G06F 3/0445 |
| 2018/0040672 | A1 * | 2/2018 | Park | H01L 27/323 |
| 2018/0308903 | A1 * | 10/2018 | Jeong | H01L 27/3276 |
| 2019/0042047 | A1 * | 2/2019 | Liao | H01L 27/124 |
| 2019/0103443 | A1 * | 4/2019 | Kim | H01L 27/323 |

FOREIGN PATENT DOCUMENTS

EP   2991116 A1   3/2016

* cited by examiner

*Primary Examiner* — Gene W Lee
(74) *Attorney, Agent, or Firm* — Birch, Stewart, Kolasch & Birch, LLP

(57) ABSTRACT

The present disclosure relates to a display device capable of providing a touch sensor structure which is resistant to noise of a display driving electrode/line such as a data line, by designing the display device such that a sensing touch line does not overlap a data line in an area where a cathode is not formed.

31 Claims, 21 Drawing Sheets

TOUCH DISPLAY DEVICE AND DISPLAY PANEL WITH REDUCED SIGNAL NOISE

CROSS-REFERENCE TO RELATED APPLICATIONS

This application claims under 35 U.S.C. § 119 the priority benefit of Korean Patent Application No. 10-2017-0141531 filed on Oct. 27, 2017 in the Korean Intellectual Property Office, which is incorporated herein by reference in its entirety into the present application.

BACKGROUND OF THE INVENTION

1. Field of the Invention

The present disclosure relates to a touch display device and a display panel.

2. Description of the Related Art

As a society develops into an information society, demand is increased for display devices in various forms for displaying images. In recent years, various display devices such as a liquid crystal display (LCD) device, a plasma display device, and an organic light-emitting diode (OLED) display device have been utilized.

Such display devices include a touch display device capable of providing a touch-based input system that enables a user to easily input information or a command intuitively and conveniently, avoiding conventional input systems such as a button, a keyboard, and a mouse.

In order for such a touch display device to provide such a touch-based input system, it is necessary to determine presence or absence of a user's touch, and to correctly detect the touch coordinates of the touch.

To this end, a capacitance-based touch sensing system for detecting presence or absence of a touch, touch coordinates, or the like based on a change in capacitance formed on a plurality of touch electrodes is widely used among various types of touch sensing systems.

In a touch display device according to the related art, when a display panel incorporates a touch panel therein, noise of a data line used for display driving flows into the touch electrodes or touch lines of the display device. Thus, there has been a problem in that the signal-to-noise ratio of touch-sensing signals decreases and touch sensitivity is degraded in the touch display device of the related art.

SUMMARY OF THE INVENTION

In view of the foregoing, an aspect of embodiments of the present disclosure is to provide a display device having a touch sensor structure, which is resistant to the noise of a display driving electrode/line of a data line and the like.

Another aspect of embodiments of the present disclosure is to provide a display device having a structure which enables a sensing touch line not to be affected by noise even when noise of a display driving electrode/line of a data line or the like occurs.

According to one aspect, embodiments of the present disclosure can provide a display device comprising an active area and a non-active area; a plurality of data lines arranged in the active area; a plurality of data link lines connected to the plurality of data lines; an encapsulation layer having at least one organic layer and at least one inorganic layer; a touch sensor having a plurality of driving touch electrodes and a plurality of sensing touch electrodes arranged on the encapsulation layer; a plurality of driving touch lines connected to the plurality of driving touch electrodes; and a plurality of sensing touch lines connected to the plurality of sensing touch electrodes, wherein in the non-active area, at least one of the plurality of data link lines overlaps at least one of the plurality of driving touch lines.

In the display device, the plurality of driving touch lines or the plurality of sensing touch lines can be arranged on a side surface of the encapsulation layer.

The display device can further comprise a touch buffer layer arranged on the encapsulation layer.

In the display device, the touch buffer layer can be arranged between the encapsulation layer and the plurality of driving touch lines or the plurality of sensing touch lines.

The display device can further comprise a touch insulation layer arranged on the touch buffer layer.

The display device can further comprise a bridge electrode arranged on the touch buffer layer.

In the display device, the touch insulation layer can be arranged between the bridge electrode and the touch sensor.

In the display device, the bridge electrode or the touch sensor can be in the form of a mesh, the mesh comprising a plurality of open areas.

The display device can further comprise an anode electrode, a cathode electrode, and a light emitting layer arranged between the anode electrode and the cathode electrode.

In the display device, the plurality of driving touch lines can overlap a first portion of the cathode electrode in the non-active area, and the plurality of sensing touch lines can overlap a second portion of the cathode electrode in the non-active area.

The display device can further comprise a bank on the anode electrode, the bank defining a plurality of pixel areas.

In the display device, each one of the plurality of open areas can overlap a corresponding one of the plurality of pixel areas.

In the display device, in the non-active area, none of the plurality of sensing touch lines can overlap any of the plurality of data link lines.

In the display device, in the active area, a plurality of driving touch lines can be arranged parallel to the plurality of data lines, and a plurality of sensing touch lines can be arranged parallel to a plurality of gate lines.

In the display device, in the non-active area, a plurality of data pads can be arranged to electrically connect the plurality of data link lines, a plurality of driving touch pads can be arranged to electrically connect the plurality of driving touch lines, a plurality of sensing touch pads can be arranged to electrically connect the plurality of sensing touch lines, and the plurality of driving touch pads can be arranged closer to the plurality of data pads than the plurality of sensing touch pads is arranged to the plurality of data pads.

The display device can further comprise a thin-film-transistor having a gate electrode, a semi-conductor layer, a source electrode, and a drain electrode.

In the display device, the plurality of driving touch pads or sensing touch pads can include a lower touch pad electrode and an upper touch pad electrode.

In the display device, the lower touch pad electrode can be formed in the same layer as the source electrode or the drain electrode.

In the display device, the upper touch pad electrode can be formed in the same layer as the plurality of driving touch electrodes or the plurality of sensing touch electrodes.

The display device can further comprise a touch pad contact hole formed through the touch insulation layer and the touch buffer layer, wherein the lower touch pad electrode is connected to the upper touch pad electrode in the touch pad contact hole.

In another aspect, there is provided a display device comprising an active area and a non-active area; an anode electrode, a cathode electrode, and a light emitting layer arranged between the anode electrode and the cathode electrode; a plurality of data lines arranged in the active area; a plurality of data link lines connected to the plurality of data lines; an encapsulation layer arranged on the cathode electrode having at least one organic layer and at least one inorganic layer; a touch sensor having a plurality of driving touch electrodes and a plurality of sensing touch electrodes arranged on the encapsulation layer; a plurality of driving touch lines connected to the plurality of driving touch electrodes, wherein the plurality of driving touch lines overlap a first portion of the cathode electrode in the non-active area; a plurality of sensing touch lines connected to the plurality of sensing touch electrodes, wherein the plurality of sensing touch lines overlap a second portion of the cathode electrode in the non-active area, and in the non-active area, at least one of the plurality of data link lines overlaps at least one of the plurality of driving touch lines.

According to the embodiments of the present disclosure described above, it is possible to provide a display device having a touch sensor structure resistant to noise of display driving electrodes/lines of data lines or the like.

According to the embodiments of the present disclosure, it is possible to provide a display device having a structure which enables a sensing touch line not to be affected by noise even when noise of a display driving electrode/line of a data line or the like occurs.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EMBODIMENTS

Figure 1:
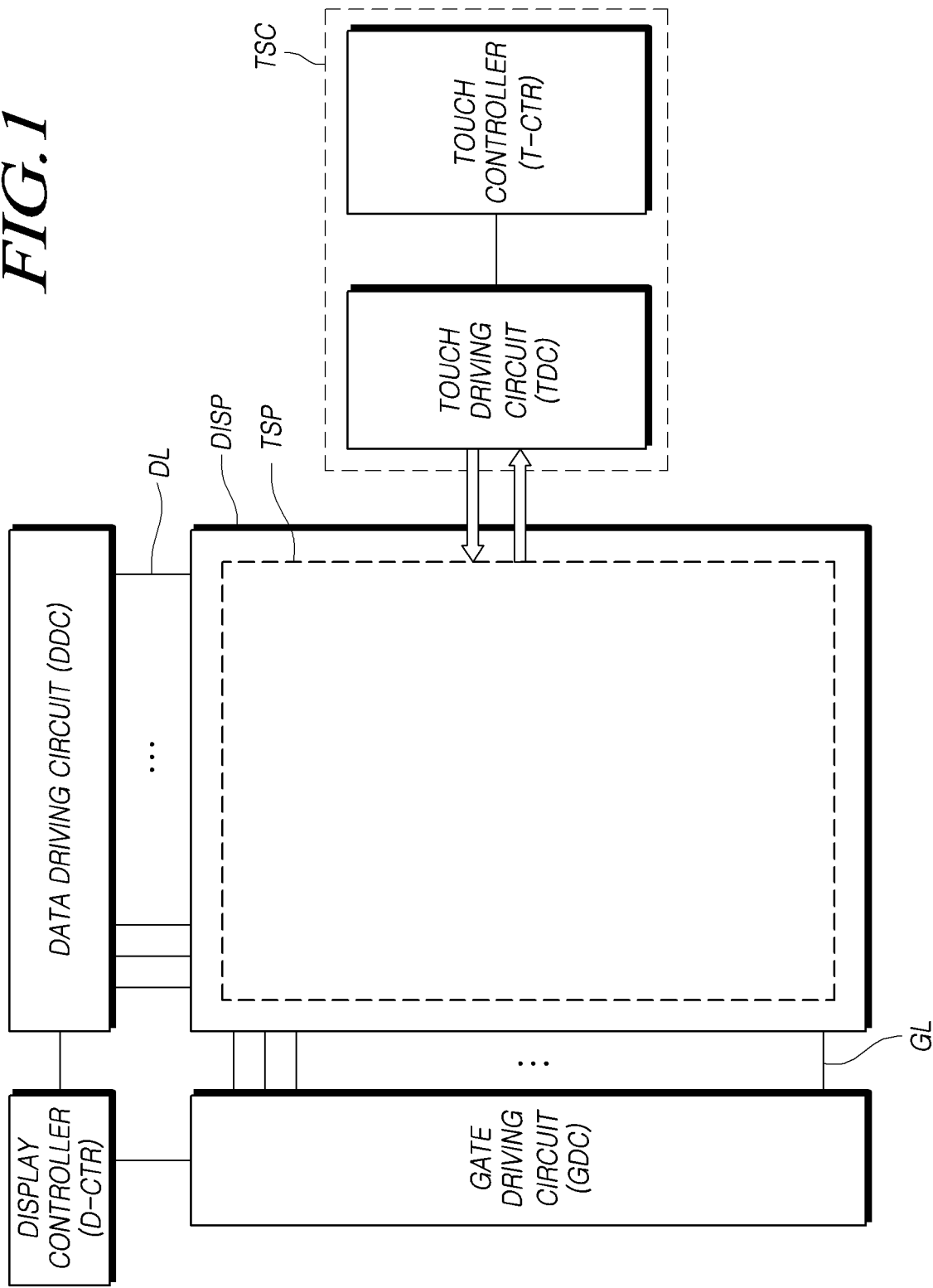
FIG. 1 is a system configuration diagram of a touch display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it can obfuscate the subject matter of the present disclosure.

In addition, terms, such as first, second, A, B, (a), (b) or the like can be used herein when describing components of the present disclosure. Each of these terminologies is not used to define an essence, order or sequence of a corresponding component but used merely to distinguish the corresponding component from other component(s). In the case that it is described that a first structural element "is connected to", "is coupled to", or "is in contact with" a second structural element, it should be interpreted that a third structural element can be connected to, be coupled to, or be in contact with the first and second structural elements, as well as that the first structural element is directly connected to or is in direct contact with the second structural element.

FIG. 1 is a system configuration diagram of a touch display device according to embodiments of the present disclosure. All the components of the touch display device according to all embodiments of the present disclosure are operatively coupled and configured.

Referring to FIG. 1, the touch display device according to the embodiments of the present disclosure can provide an image display function for displaying images and a touch sensing function for sensing a user's touch.

The touch display device according to the embodiments of the present disclosure can include a display panel DISP in which data lines DL and gate lines GL are arranged, a display driving circuit configured to drive the display panel DISP, and the like, for image display.

The display driving circuit can include a data driving circuit DDC configured to drive data lines DL, a gate driving circuit GDC configured to drive gate lines GL, a data driving circuit DDC, a display controller D-CTR configured to control the gate driving circuit GDC, and the like.

The touch display device according to the embodiments of the present disclosure can include a touch panel TSP including a plurality of touch electrodes as touch sensors for touch sensing, and a touch sensing circuit TSC configured to perform driving and sensing processing of the touch panel TSP, and the like.

The touch sensing circuit TSC supplies a driving signal to the touch panel TSP in order to drive the touch panel TSP, detects a sensing signal from the touch panel TSP, and senses presence or absence of a touch and/or a touch position (e.g., touch coordinates).

Such a touch sensing circuit TSC can include a touch driving circuit TDC configured to supply a driving signal and to receive a sensing signal, a touch controller T-CTR configured to calculate presence or absence of a touch and/or a touch position (e.g., touch coordinates), and the like.

The touch sensing circuit TSC can be implemented with one or more components (e.g., integrated circuits), and can be implemented separately from the display driving circuit.

In addition, the entirety or a part of the touch sensing circuit TSC can be integrated with the display driving circuit or one or more of the internal circuits of the display driving circuit. For example, the touch driving circuit TDC of the touch sensing circuit TSC can be implemented as an integrated circuit together with the data driving circuit DDC of the display driving circuit.

Meanwhile, the touch display device according to the embodiments of the present disclosure is capable of sensing a touch based on a capacitance formed on the touch electrodes TE.

The touch display device according to the embodiments of the present disclosure adopts a capacitance-based touch sensing scheme, and is also capable of sensing a touch with a mutual-capacitance-based touch sensing scheme.

Meanwhile, the display panel DISP of the touch display device according to the embodiments of the present disclosure can be of various types such as an organic light-emitting diode (OLED) panel and a liquid crystal display (LCD) panel. Hereinafter, for the convenience of explanation, an OLED panel will be mainly described as an example.

Meanwhile, in the touch display device according to the embodiments of the present disclosure, a touch panel TSP can be of an externally-attached type which is manufactured separately from a display panel DISP and bonded to the display panel DISP, or can be of a built-in type which is manufactured together with a display panel DISP and is present inside the display panel DISP.

In the case of the built-in type where the touch panel TSP is present inside the display panel DISP, the touch panel TSP can be regarded as an assembly of touch electrodes incorporated in the display panel DISP.

Hereinafter, for the convenience of explanation, it is assumed that the touch panel TSP is a built-in type existing inside the display panel DISP, but can be of other types.

Figure 2:
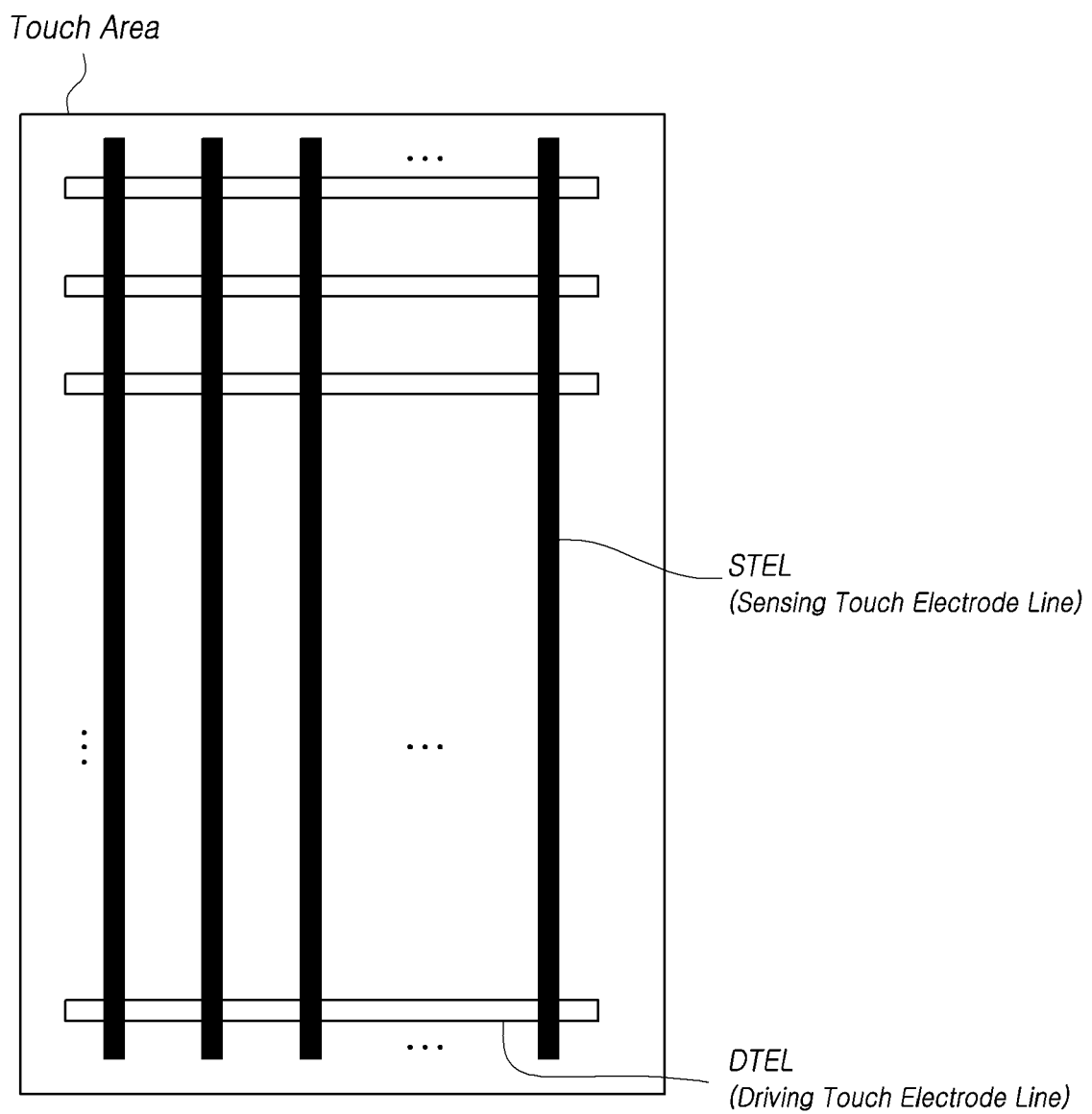
FIG. 2 is a schematic diagram illustrating a touch sensor structure within a touch area of a display panel in the touch display device according to embodiments of the present disclosure.
Figure 3:
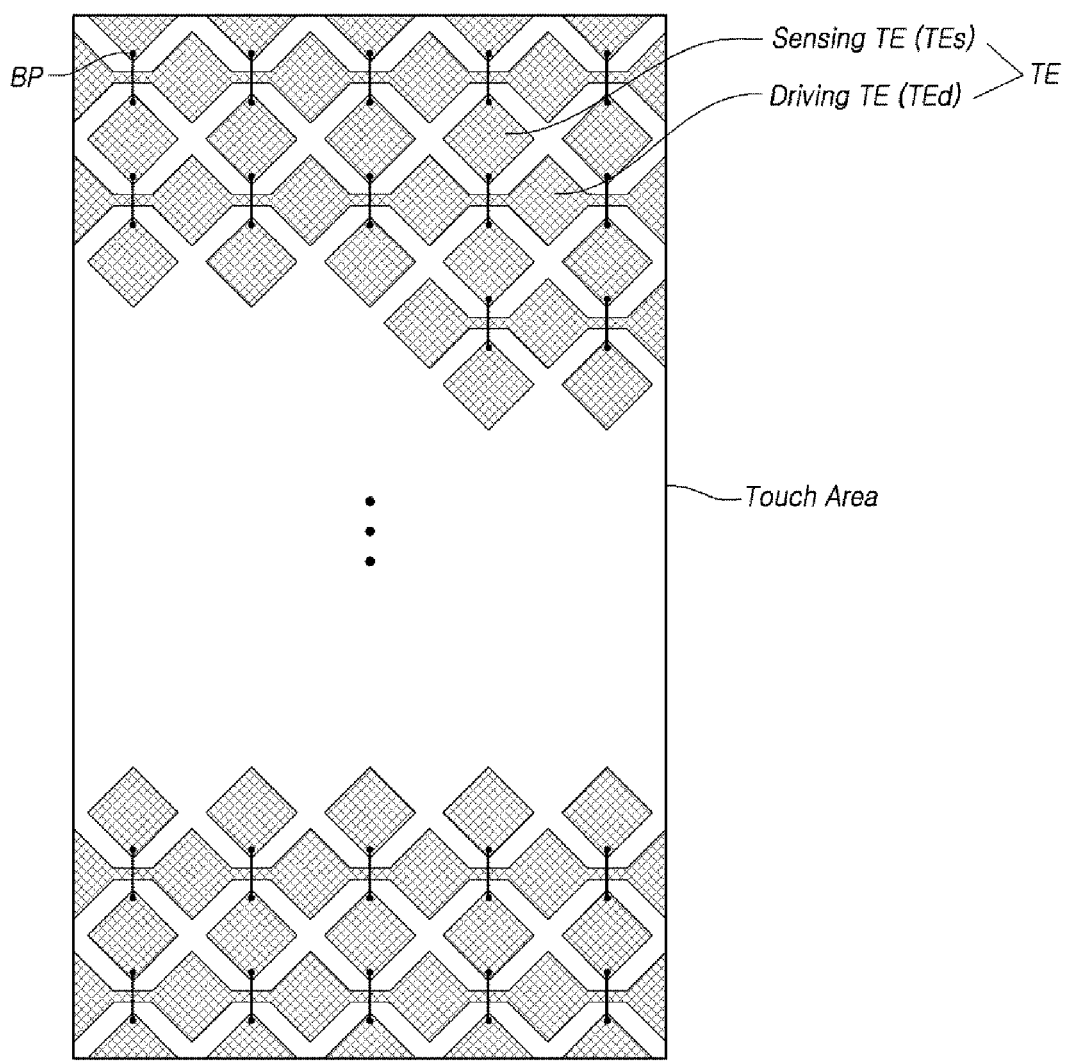
FIG. 3 is a diagram illustrating an example of the touch sensor structure within the touch area of the display panel according to the embodiments of the present disclosure.

FIG. 2 is a schematic diagram illustrating a touch sensor structure within a touch area (Touch Area) of the display panel DSP according to the embodiments of the present disclosure. FIG. 3 is a schematic diagram illustrating an example of the touch sensor structure within the touch area (Touch Area) of the display panel DSP of FIG. 2 according to the embodiments of the present disclosure.

Referring to FIGS. 2 and 3, touch electrodes TE are disposed in the touch area (Touch Area) of the display panel DISP.

In the display panel DISP, the touch area can be an area in which a user can perform touch input and can be an active area A/A in which an image is displayed.

Referring to FIGS. 2 and 3, when the touch display device according to the embodiments of the present disclosure senses a touch by a mutual-capacitance-based touch sensing scheme, the plurality of touch electrodes TE, disposed in the touch area of the display panel DISP, can be classified into a driving touch electrode TEd to which a driving signal is applied and a sensing touch electrode TEs configured to sense a sensing signal and form a capacitance with the driving touch electrode.

Here, the driving touch electrode TEd is also referred to as a driving electrode, a transmission electrode, a driving line, or the like. The sensing touch electrode TEs can be referred to as a sensing electrode, a reception electrode, a sensing line, or the like.

A plurality of driving touch electrodes TEd arranged in the same row (or the same column) are electrically connected to each other by being integrated, i.e. being formed in a single piece, (or by a connection using a bridge electrode BP) so as to form one driving touch electrode line DTEL. The bridge electrode BP can be a bridge in the form of a mesh, the mesh comprising a plurality of open areas OA.

A plurality of sensing touch electrodes TEs arranged in the same column (or the same row) are electrically connected to each other by a bridge electrode BP (or by being integrated) so as to form one sensing touch electrode line STEL.

In the case of the mutual-capacitance-based touch sensing scheme, the touch sensing circuit TSC applies a driving signal to one or more driving touch electrode lines DTEL and receives a sensing signal from one or more sensing touch electrode lines STEL. The term "sensing touch electrode lines STEL" is used herein to refer to the portion of the sensing touch lines in the active area A/A. Similarly, the term "driving touch electrode lines DTEL" is used herein to refer to the portion of the driving touch lines in the active area A/A of the display. The presence or absence of a touch, and/or coordinates or the like, is detected using the received sensing signal and is based on a change in capacitance (mutual-capacitance) between the driving touch electrode lines DTEL and the sensing touch electrode lines STEL, where the change in capacitance depends on the presence or absence of a pointer such as a finger or a pen.

For driving signal transmission and sensing signal transmission, each of the plurality of driving touch electrode lines DTEL and the plurality of sensing touch electrode lines STEL is electrically connected to a touch driving circuit TDC via one or more touch lines.

Figure 4:
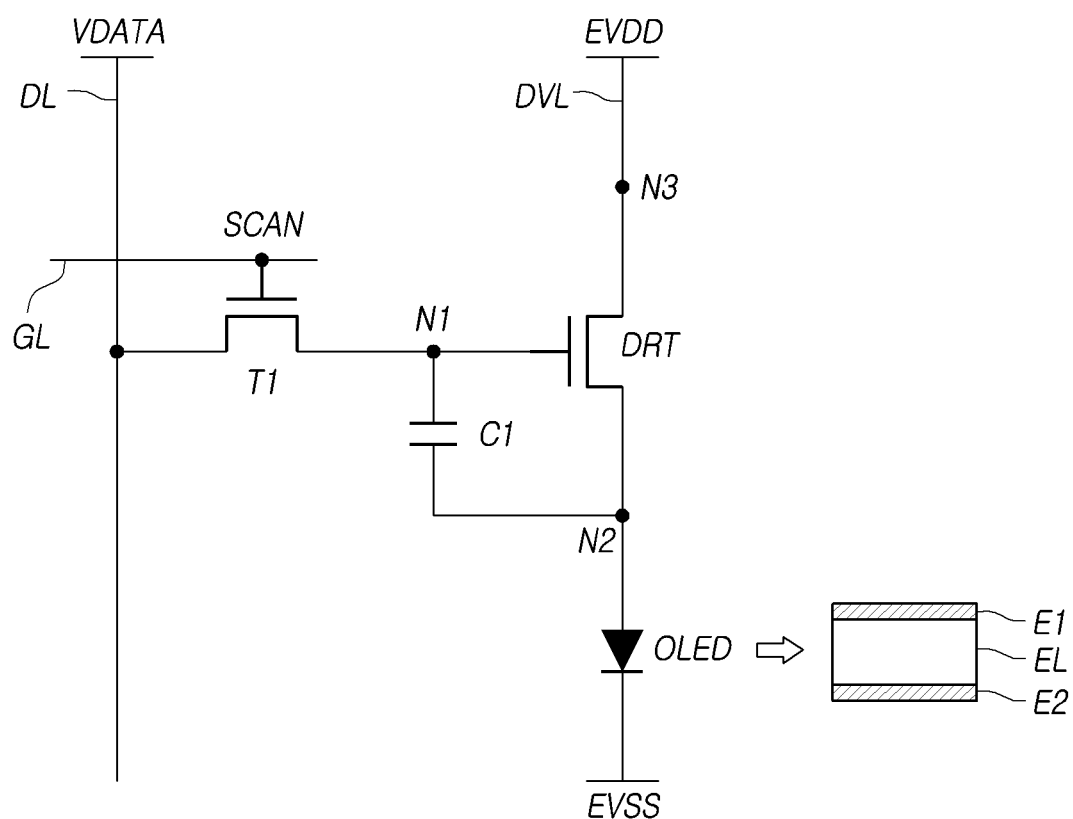
FIG. 4 is a diagram illustrating a sub-pixel structure of the display panel according to the embodiments of the present disclosure.
Figure 5:
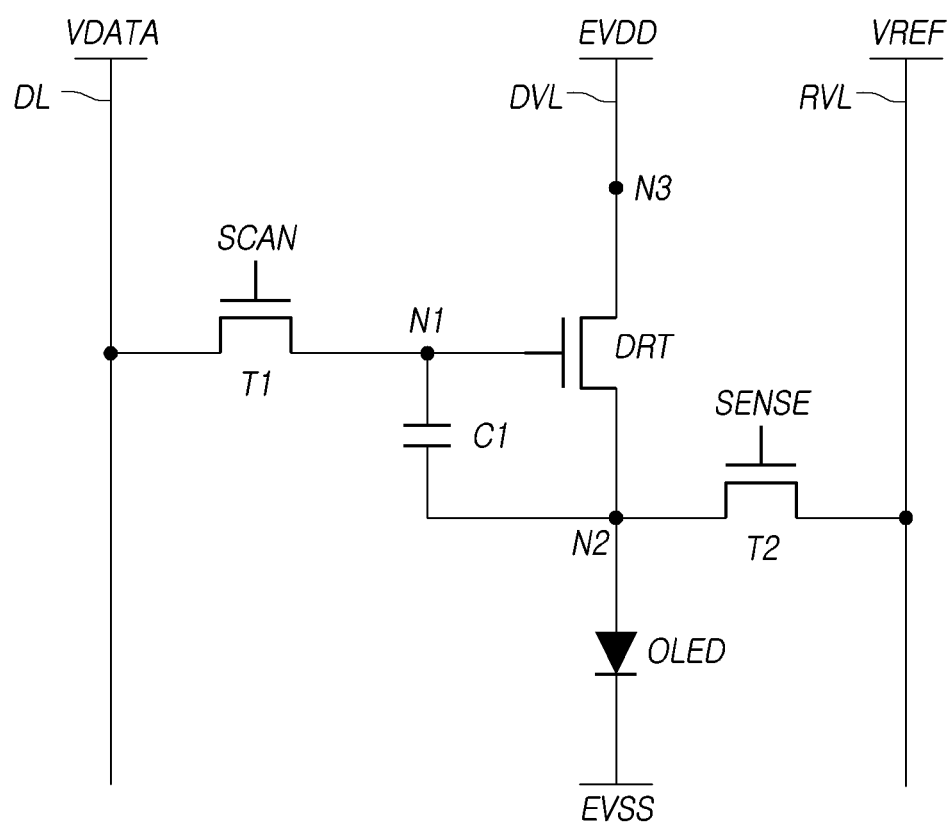
FIG. 5 is a diagram illustrating another example of the sub-pixel structure of the display panel according to embodiments of the present disclosure.

FIG. 4 is a diagram illustrating a sub-pixel structure of the display panel DISP according to the embodiments of the present disclosure, and FIG. 5 is a diagram illustrating another example of the sub-pixel structure of the display panel DISP according to the embodiments of the present disclosure.

Referring to FIG. 4, when the touch display device 100 according to the embodiments is an OLED display device, each sub-pixel can include an OLED, a driving transistor DRT configured to drive the OLED, a first transistor T1 configured to transmit a data voltage to a first node N1 corresponding to a gate node of the driving transistor DRT, and a storage capacitor C1 configured to maintain a data voltage corresponding to an image signal voltage or a voltage corresponding thereto for one frame period.

The OLED can include a first electrode E1 (e.g., an anode electrode or a cathode electrode), an organic light-emitting layer EL, a second electrode E2 (e.g., a cathode electrode or an anode electrode), and the like.

A ground voltage EVSS can be applied to the second electrode E2 of the OLED.

The driving transistor DRT drives the OLED by supplying a driving current to the OLED. The driving transistor DRT has a first node N1, a second node N2, and a third node N3.

The first node N1 of the driving transistor DRT is a node corresponding to a gate node, and can be electrically connected to a source node or a drain node of the first transistor T1.

The second node N2 of the driving transistor DRT can be electrically connected to the first electrode E1 of the OLED, and can be a source node or a drain node.

The third node N3 of the driving transistor DRT can be a node to which a driving voltage EVDD is applied, and can be electrically connected to a driving voltage line DVL that supplies the driving voltage EVDD. The third node N3 can be a drain node or a source node.

The first transistor T1 is electrically connected between the data line DL and the first node N1 of the driving transistor DRT, and can be controlled by receiving a scan signal SCAN applied to the gate node thereof through the gate line GL.

The first transistor T1 can be turned on by the scan signal SCAN so as to transmit the data voltage Vdata supplied from the data line DL to the first node N1 of the driving transistor DRT.

The storage capacitor C1 can be electrically connected between the first node N1 and the second node N2 of the driving transistor DRT.

The storage capacitor C1 is not a parasitic capacitor which is an internal capacitor existing between the first node N1 and the second node N2 of the driving transistor DRT, but an external capacitor intentionally designed outside the driving transistor DRT.

Meanwhile, as illustrated in FIG. 5, each sub-pixel can further include a second transistor T2 in order to control the voltage of the second node N2 of the driving transistor DRT or to sense the characteristic value of the sub-pixel (e.g., the threshold voltage or mobility of the driving transistor DRT or the threshold voltage of the OLED).

The second transistor T2 can be electrically connected between the second node N2 of the driving transistor DRT and the reference voltage line RVL that supplies a reference voltage VREF, and can be controlled by receiving, with the gate node, a sensing signal SENSE, which is a kind of scan signal.

The second transistor T2 is turned on by the sensing signal SENSE to apply the reference voltage VREF supplied via the reference voltage line RVL to the second node N2 of the driving transistor DRT.

In addition, the second transistor T2 can be utilized as one of voltage sensing paths for the second node N2 of the driving transistor DRT.

Meanwhile, the scan signal SCAN and the sense signal SENSE can be separate gate signals. In this case, the scan signal SCAN and the sensing signal SENSE can be respectively applied to the gate node of the first transistor T1 and the gate node of the second transistor T2 via different gate lines GL.

In some cases, the scan signal SCAN and the sensing signal SENSE can be the same gate signal. In this case, the scan signal SCAN and the sensing signal SENSE can be commonly applied to the gate node of the first transistor T1 and the gate node of the second transistor T2 via the same gate line.

Each of the driving transistor DRT, the first transistor T1, and the second transistor T2 can be an n-type transistor or a p-type transistor. Similarly, each of the driving transistor DRT, the first transistor T1, and the second transistor T2 can be a thin film transistor. Each of the driving transistor DRT, the first transistor T1, the second transistor T2 can have a gate electrode, a semi-conductor layer, a source electrode and a drain electrode.

Each sub-pixel structure can be modified in various ways in addition to those illustrated in FIGS. 4 and 5.

Figure 6:
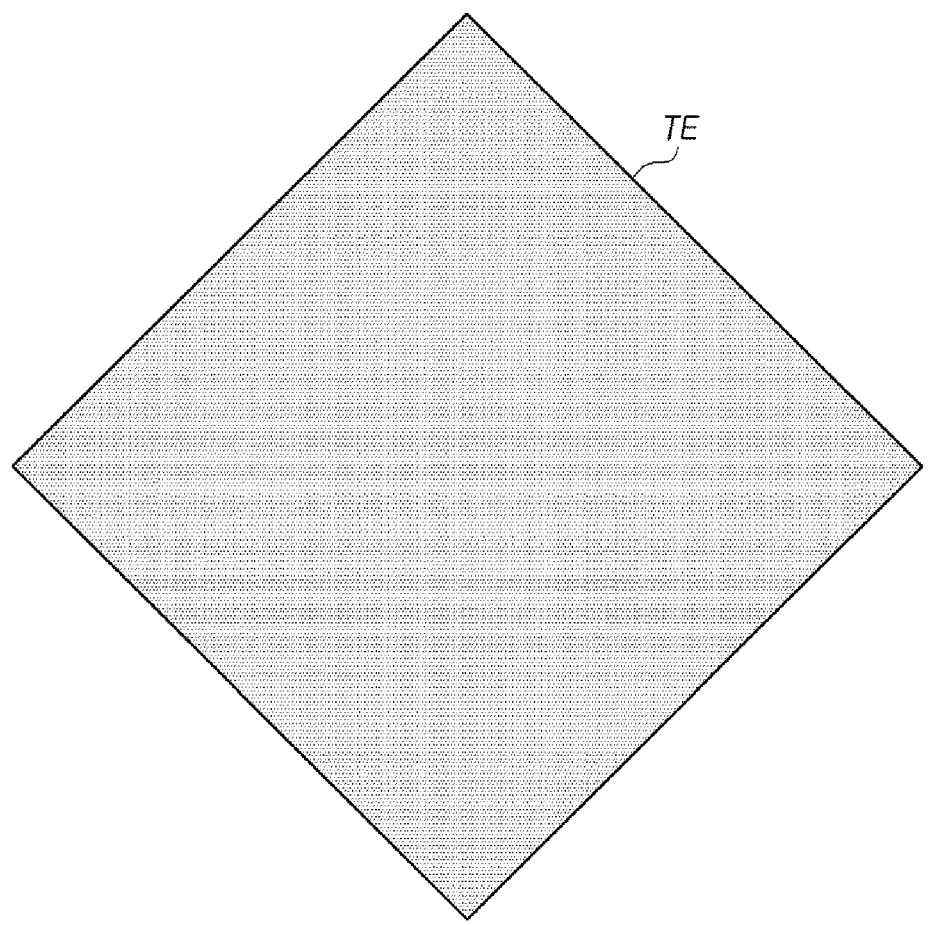
FIG. 6 is a diagram illustrating a non-mesh type touch electrode in the touch panel according to the embodiments of the present disclosure.

FIG. 6 is a diagram illustrating a non-mesh type touch electrode TE in the display panel DISP according to the embodiments of the present disclosure.

Referring to FIG. 6, in the touch display device according to the embodiments of the present disclosure, each of the plurality of touch electrodes TE disposed on the display panel DISP can be of a non-mesh type.

The non-mesh type touch electrode TE can be a plate-shaped electrode metal having no open area.

In this case, the touch electrode TE can be a transparent electrode.

Figure 7:
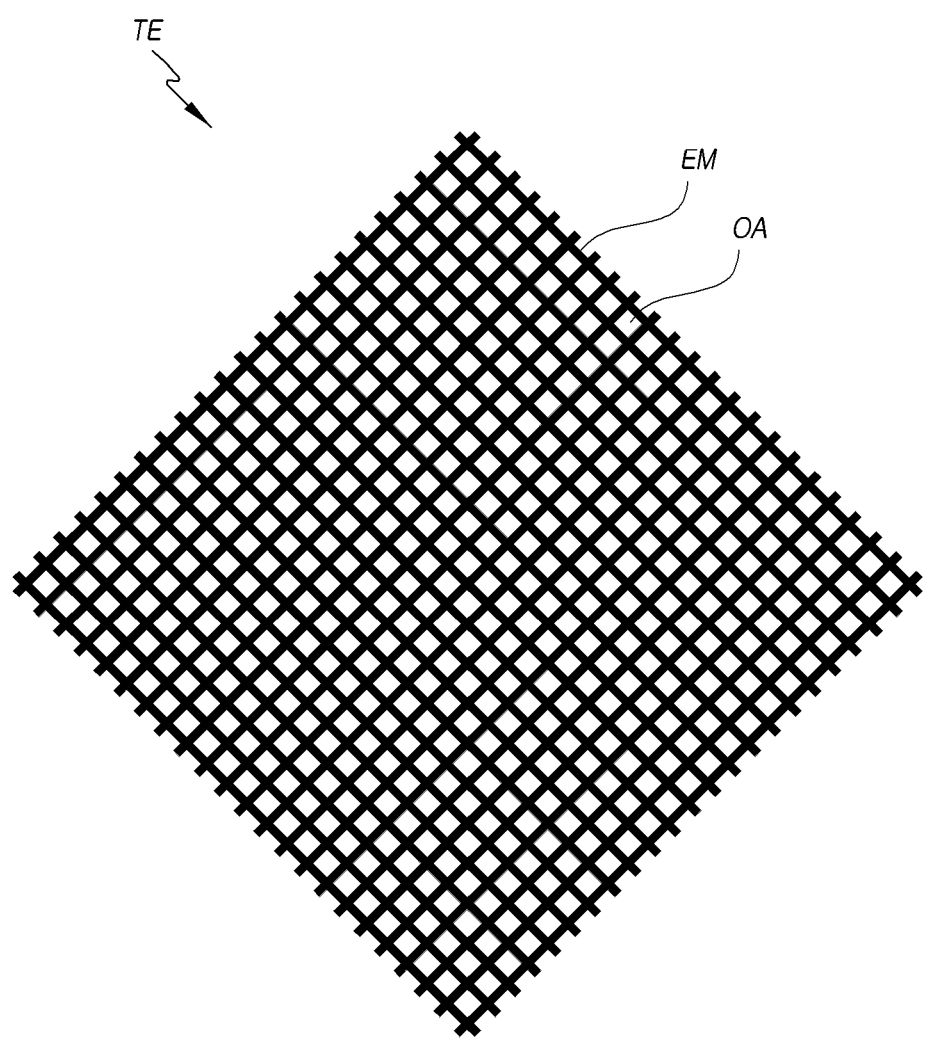
FIG. 7 is a diagram illustrating a mesh type touch electrode in the touch panel according to the embodiments of the present disclosure.
Figure 8:
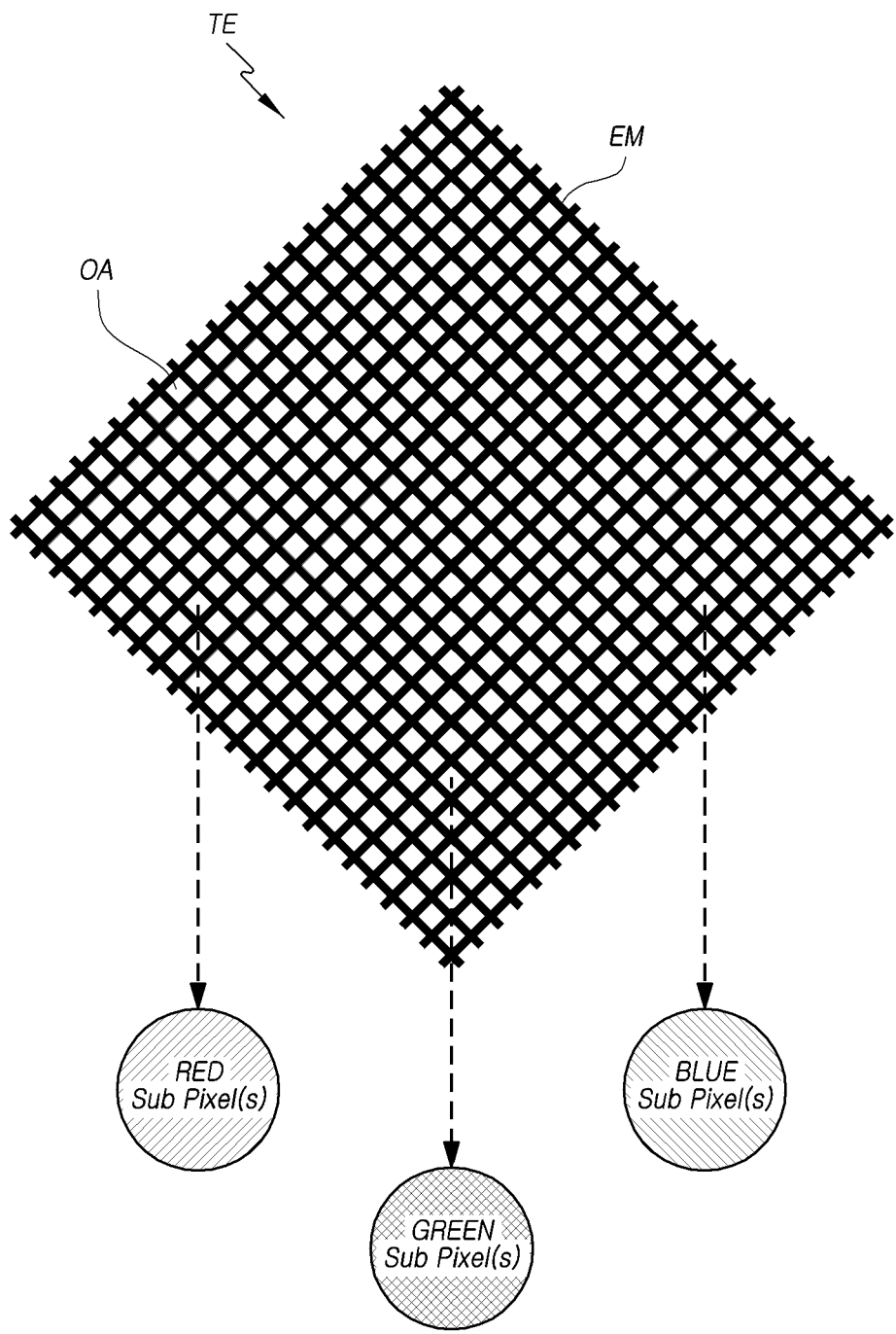
FIG. 8 is a diagram for explaining a correspondence relationship between a mesh-type touch electrode and sub-pixels in the display panel according to the embodiments of the present disclosure.

FIG. 7 is a diagram illustrating a mesh type touch electrode TE disposed in the display panel DISP according to the embodiments of the present disclosure, and FIG. 8 is a diagram for explaining a correspondence relationship between a mesh-type touch electrode TE and sub-pixels in the touch panel DISP according to the embodiments of the present disclosure.

Referring to FIG. 7, in the touch display device according to the embodiments of the present disclosure, each of the plurality of touch electrodes TE disposed on the display panel DISP can be of a mesh type.

The mesh type touch electrode TE can be made of an electrode metal EM patterned in the form of a mesh.

Accordingly, a plurality of open areas OA can exist in the area of the mesh-type touch electrode TE. Each of the plurality of open areas OA can overlap a corresponding one of the plurality of pixel areas defined by the bank BK in the first electrode E1.

Referring to FIG. 8, each of a plurality of open areas OA existing in the area of the touch electrode TE made of an electrode metal EM patterned in the mesh type can correspond to a light-emitting area of one or more sub-pixels.

For example, each of the plurality of open areas OA existing in the area of one touch electrode TE can correspond to at least one of red, green, and blue sub-pixels.

In another example, each of the plurality of open areas OA existing in the area of one touch electrode TE can correspond to at least one of red, green, blue, and white sub-pixels.

As described above, since the light-emitting area of one or more sub-pixels is present in each of the open areas OA of each touch electrode TE in a plan view, it is possible to further increase the aperture ratio and light emission efficiency of a display panel DISP while enabling touch sensing.

As described above, the outline of one touch electrode TE can be approximately rhombic, rectangular (including a square), or the like, and an open area OA corresponding to a hole in one touch electrode TE can also be rhombic, rectangular (can include square), or the like.

However, the shape of the touch electrode TE and the shape of the open area OA can be variously modified and designed in consideration of the shape of sub-pixels, the arrangement structure of the sub-pixels, touch sensitivity, and the like.

Figure 9:
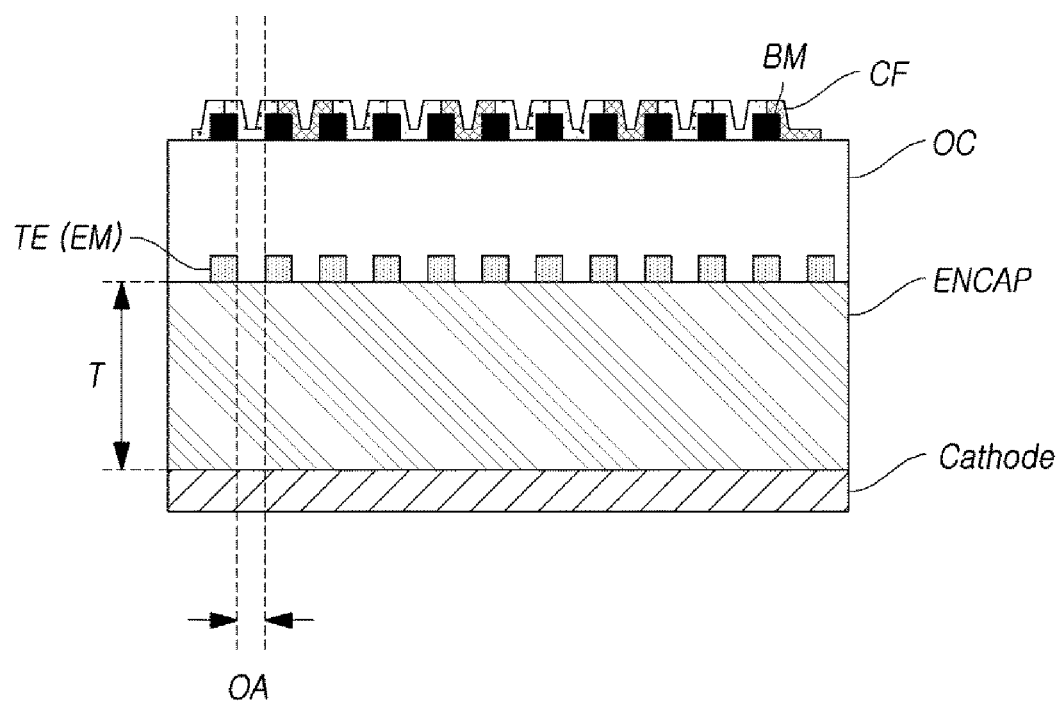
FIG. 9 is a cross-sectional view illustrating a touch area of the display panel according to the embodiments of the present disclosure.
Figure 10:
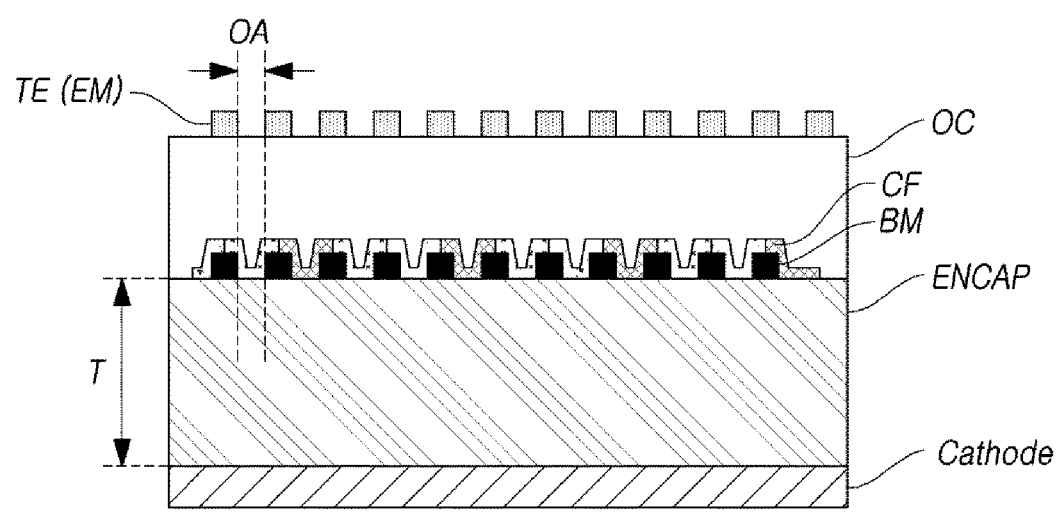
FIG. 10 is a cross-sectional view illustrating another example of the touch area of the display panel according to the embodiments of the present disclosure.

FIG. 9 is a cross-sectional view illustrating a touch area of the display panel DISP according to the embodiments of the present disclosure, and FIG. 10 is a cross-sectional view illustrating another example of the touch area of the display panel DISP according to the embodiments of the present disclosure.

Referring to FIGS. 9 and 10, when a touch panel TSP is built in a display panel DISP and the display panel DISP is implemented as an OLED display panel, the touch panel TSP can be arranged on an encapsulation layer ENCAP in the display panel DISP. In other words, touch sensor metal such as a plurality of touch electrodes TE can be arranged on the encapsulation layer ENCAP in the display panel DISP.

As described above, by forming the touch electrodes TE on the encapsulation layer ENCAP, the touch electrodes TE can be formed without significantly affecting the display performance and the formation of a display-related layer.

Meanwhile, referring to FIGS. 9 and 10, a cathode (Cathode), which can be the second electrode E2 of the OLED, can be present below the encapsulation layer ENCAP.

The thickness T of the encapsulation layer ENCAP can be, for example, 5 micrometers or more.

As described above, parasitic capacitance formed between the cathode (Cathode) of the OLED and the touch electrodes TE can be reduced by designing the thickness of the encapsulation layer ENCAP to be 5 micrometers or more. Thus, it is possible to prevent a deterioration in touch sensitivity due to parasitic capacitance.

As described above, each of the plurality of touch electrodes TE is patterned in the form of a mesh in which the electrode metal EM has a plurality of open areas OA. In the plurality of open areas OA, one or more sub-pixels or light-emitting areas thereof can be seen when viewed in a plan view.

As described above, the electrode metals EM of the touch electrodes TE are patterned such that, when viewed in a plan view, the light-emitting area of at least one sub-pixel corresponds to the position of each of the open areas OA within the touch electrodes TE, it is possible to enhance the light emission efficiency of the display panel DISP.

Accordingly, as illustrated in FIGS. 9 and 10, the position of a black matrix BM can correspond to the position of the electrode metals EM of the touch electrodes TE.

In addition, the positions of a plurality of color filters CF correspond to the positions of the plurality of touch electrodes TE.

As described above, since the plurality of color filters CF are located at positions corresponding to the positions of the plurality of open areas OA, it is possible to provide an OLED display panel (in particular, when a white OLED is used) and a touch display device having an improved light emission performance.

The positional relationship between the plurality of color filters CF and the plurality of touch electrodes TE will now be described.

As illustrated in FIG. 9, the plurality of color filters CF and the black matrix BM can be arranged on the plurality of touch electrodes TE.

The plurality of color filters CF and the black matrix BM can be arranged on an overcoat layer OC on the plurality of touch electrodes TE.

In another example as illustrated in FIG. 10, the plurality of color filters CF and the black matrix BM can be arranged under the plurality of touch electrodes TE.

The plurality of touch electrodes TE can be arranged on the overcoat layer OC on the plurality of color filters CF and the black matrix BM.

As described above, it is possible to provide a touch display device having an optimal positional relationship between the color filters CF and the touch electrodes TE in consideration of display performance such as light-emitting performance, and touch performance.

Meanwhile, attempts to incorporate a touch panel TSP including touch electrodes TE in a display panel DISP have been made in order to improve manufacturing convenience of the touch display device and to reduce the size of the touch display device.

However, in order to incorporate the touch panel TSP in the display panel DISP, which is an OLED display panel, considerable difficulties and many limitations exist.

For example, during the manufacturing process of a display device DISP, which is an OLED display panel, there is a limit in that a high-temperature process for forming touch electrodes TE, which are generally made of a metallic material, inside the panel cannot be freely performed due to an organic material.

It is difficult to arrange the touch electrodes TE serving as touch sensors inside the display panel DISP, which is an OLED display panel, due to constraints such as structural characteristics and the process of manufacturing the OLED display panel. Therefore, in the related art, a touch structure has been implemented by attaching a touch panel TSP onto a display panel DISP, which is an OLED display panel, rather than incorporating the touch panel TSP in a display panel DISP, which is an OLED display panel.

However, as illustrated in FIGS. 9 and 10 of the present disclosure, it is possible to provide a display panel DISP, which is an OLED display panel, in which a touch panel TSP having excellent display performance and touch performance is incorporated through a structure of forming the touch electrodes TE on the encapsulation layer ENCAP, for example. These features effectively address the limitations and disadvantages associated with the related art.

Figure 11:
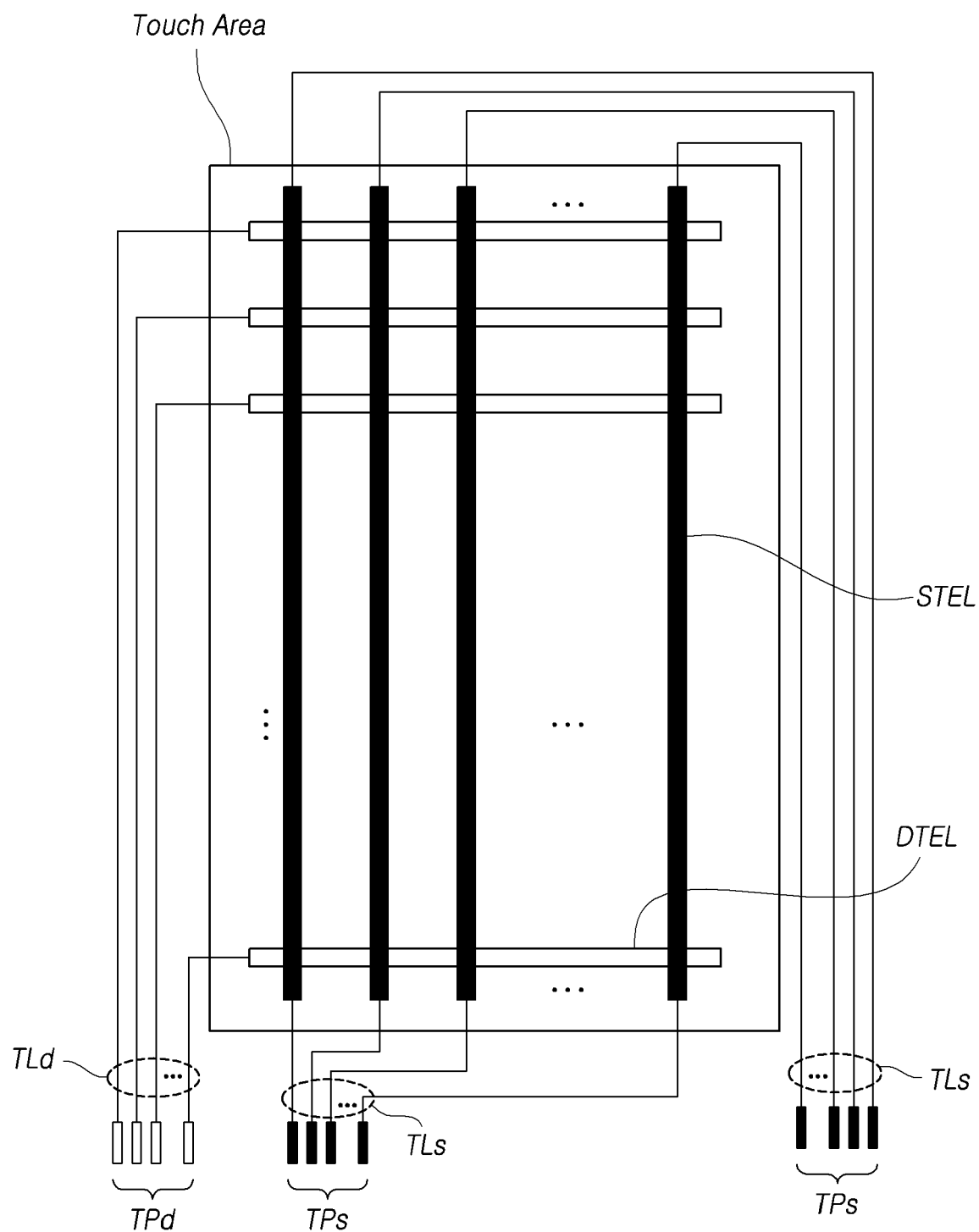
FIG. 11 is a diagram illustrating a first touch sensor structure of the display panel according to the embodiments of the present disclosure.
Figure 12:
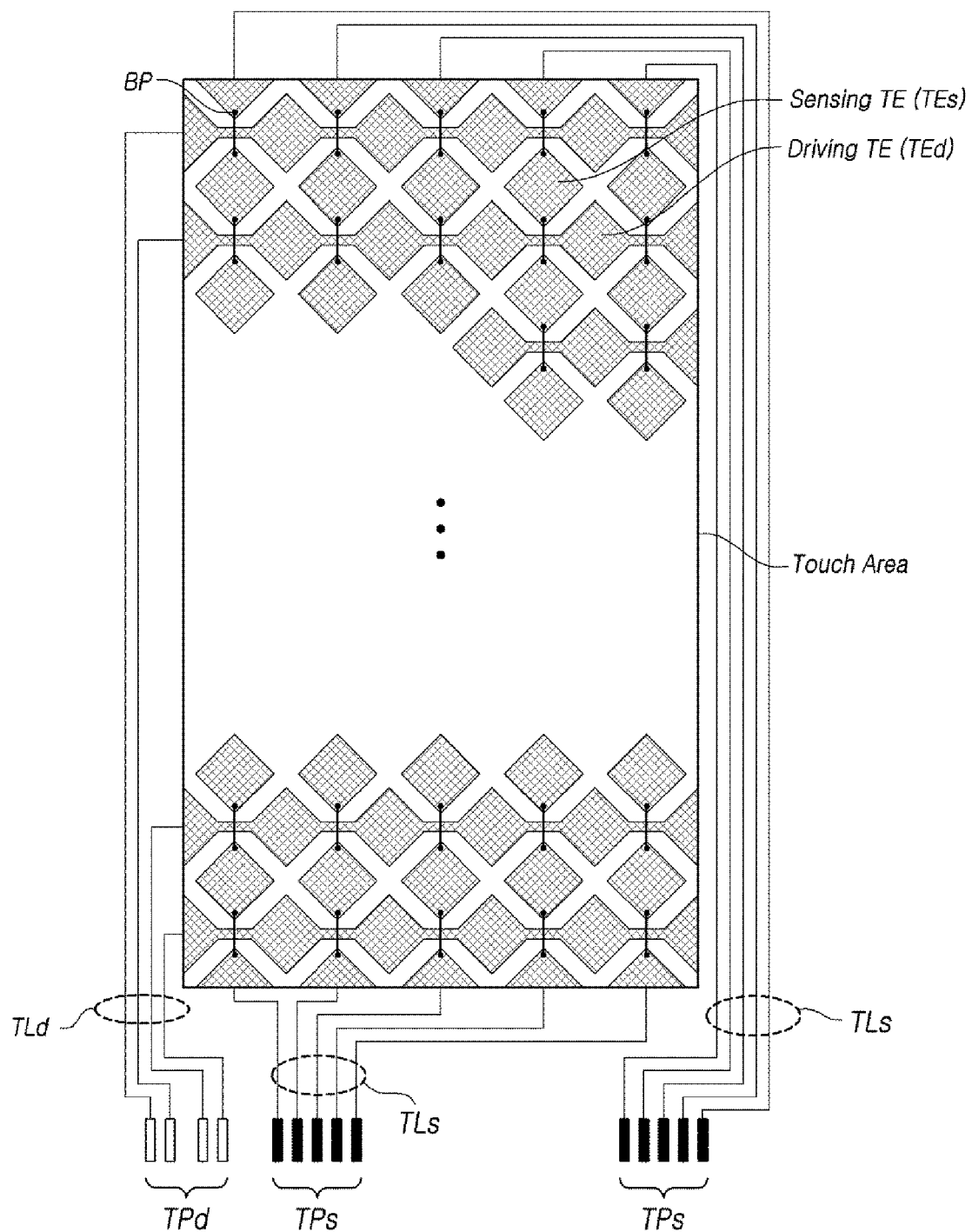
FIG. 12 is a diagram illustrating an example of the first touch sensor structure of the display panel according to the embodiments of the present disclosure.
Figure 13:
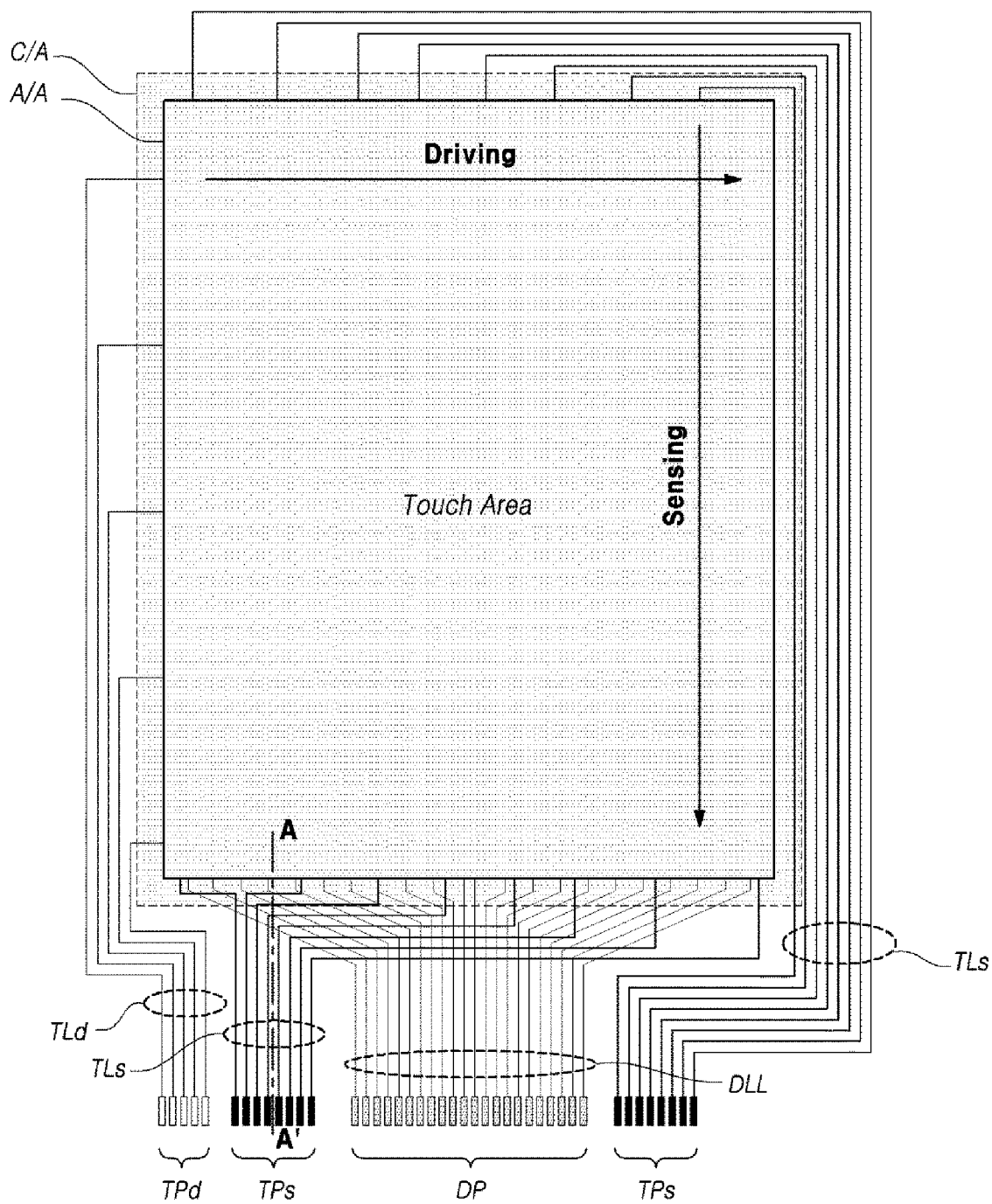
FIG. 13 is a diagram illustrating a structure in which driving touch lines, sensing touch lines, and data link lines are disposed in a non-active area according to a first touch sensor structure of the display panel according to the embodiments of the present disclosure.
Figure 14:
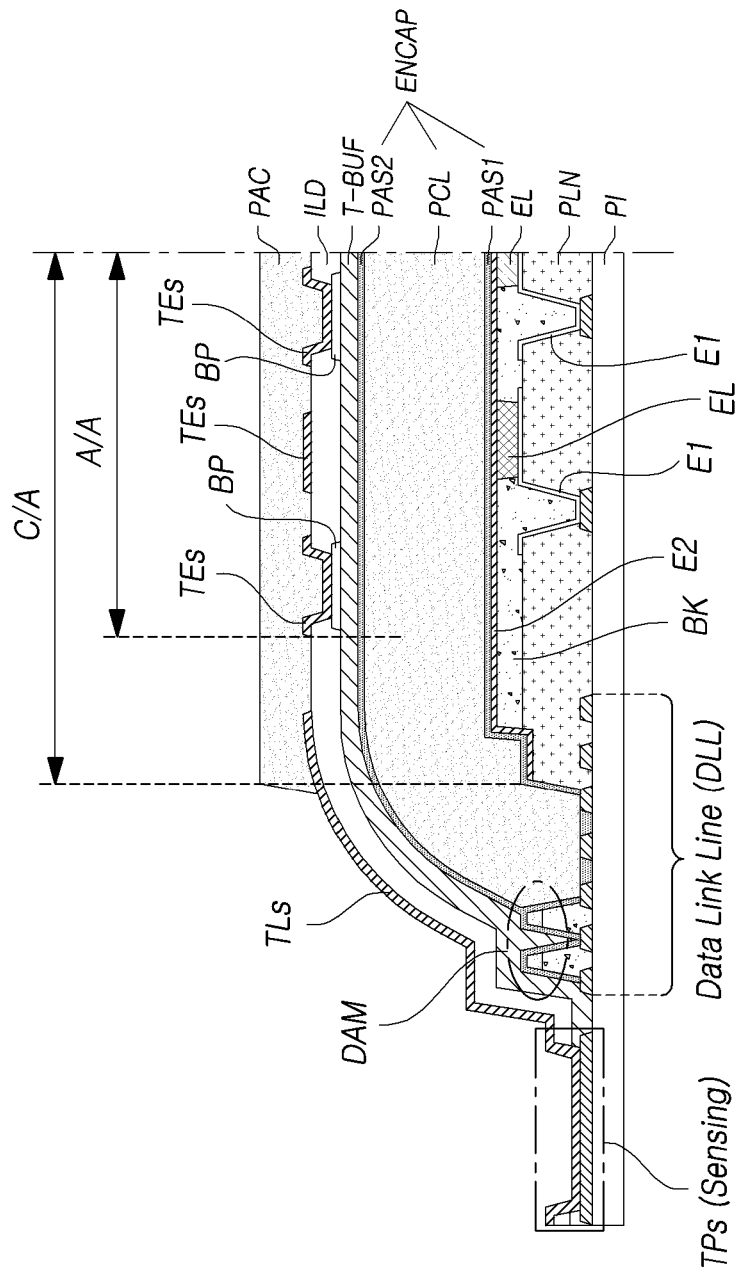
FIG. 14 is a cross-sectional view of a portion A-A' of FIG. 13.

FIG. 11 is a diagram illustrating a first touch sensor structure of the display panel DISP according to the embodiments of the present disclosure, and FIG. 12 is a diagram illustrating an example of the first touch sensor structure of the display panel DISP according to an exemplary embodiment of the present disclosure. FIG. 13 is a diagram illustrating a structure in which driving touch lines TLd, sensing touch lines TLs, and data link lines DLL are disposed in a non-active area N/A which is an outer area of the active area A/A according to the first touch sensor structure of the display panel DISP according to the embodiments of the present disclosure. FIG. 14 is a cross-sectional view of a portion A-A' of FIG. 13.

Referring to FIGS. 11 to 13, in order to drive the touch panel TSP, each of the plurality of driving touch electrode lines DTEL is electrically connected to at least one driving touch line TLd. Each driving touch line TLd is electrically connected to the touch driving circuit TDC via a driving touch pad TPd.

Referring to FIGS. 11 to 13, in order to sense the touch panel TSP, each of the plurality of sensing touch electrode lines STEL is electrically connected to one or more sensing touch lines TLs. Each sensing touch line TLd is electrically connected to the touch driving circuit TDC via a sensing touch pad TPs.

Referring to FIGS. 11 to 13, a line arrangement structure for each area of the display panel DISP will be described below.

A plurality of data lines DL and a plurality of gate lines GL are arranged in the active area A/A of the display panel DISP.

A plurality of driving touch electrode lines DTEL and a plurality of sensing touch electrode lines STEL are arranged in the active area A/A of the display panel DISP.

In the non-active area N/A, which is an area outside the active area A/A of the display panel DISP, a plurality of data lines DL extend or a plurality of data link lines DLL connected to the plurality of data lines DL are arranged. In other words, each of the plurality of data lines DL extends from a corresponding one of the plurality of data link lines DLL, or each of the plurality of data lines DL is be connected to a corresponding one of the plurality of data link lines DLL. Also, in the non-active area N/A, a plurality of driving touch lines TLd connected to the plurality of driving touch electrode lines DTEL are arranged, and a plurality of sensing touch lines TLs connected to the plurality of sensing touch electrode lines STEL are arranged.

According to the first touch sensor structure of the display panel DISP, in the active area A/A corresponding to the touch area of the display panel DISP, the plurality of driving touch electrode lines DTEL can be disposed in the same direction as the plurality of gate lines GL and the plurality of sensing touch electrode lines STEL can be disposed in the same direction as the plurality of data lines DL.

According to the first touch sensor structure of the display panel DISP, in the non-active area which is an outer area of the active area A/A of the display panel DISP, a plurality of data ling lines DLL from which a plurality of data lines DL extend or to which a plurality of data link lines DLL are connected can be disposed, a plurality of driving touch lines TLd connected to the plurality of driving touch electrode lines DTEL can be disposed, and a plurality of sensing touch lines TLs connected to the plurality of sensing touch electrode lines STEL can be disposed.

Referring to FIG. 13, a cathode formation area C/A can have a size which is substantially equal to, equal to, or larger than the active area A/A.

According to the first touch sensor structure of the display panel DISP, in the non-active area N/A of the display panel DISP, all or some of the plurality of sensing touch lines TLs can overlap at least one of the plurality of data link lines DLL.

However, in the non-active area N/A of the display panel DISP, none of the plurality of driving touch lines TLd can overlap any of with the plurality of data link lines DLL.

Referring to FIG. 14, a polyimide layer PI is arranged on a substrate or a back plate.

The polyimide layer PI can be flexible. The polyimide layer PI can be arranged on the substrate or can be present without a substrate.

Further, only the substrate can be present without the polyimide layer PI. Here, the substrate can be flexible or non-flexible.

A source-drain layer can be present on the polyimide layer PI. In the source-drain layer, various signal lines such as a data line DL, source/drain electrodes of various transistors, and the like can be formed in the active area A/A.

In addition, in the source-drain layer, a data link line DLL, a touch pad (e.g., TPs), and the like can be formed in the non-active area N/A. In particular, as is discussed below, a lower touch pad electrode can be formed in the source-drain layer.

A planarization layer PLN can be arranged on the source-drain layer.

On the planarization layer PLN, a first electrode E1 is located at the light-emitting position of each sub-pixel, and a bank BK is arranged on the first electrode E1. Here, the first electrode E1 exists in each sub-pixel, and thus can be called a pixel electrode. The bank defines a plurality of pixels areas.

An organic light-emitting layer EL is arranged on the first electrode E1 between two adjacent banks BK.

A second electrode E2 can be arranged on the organic light-emitting layer EL. Here, the second electrode E2 can be a common electrode formed in common to all sub-pixel areas.

On the second electrode E2, an encapsulation layer ENCAP for preventing penetration of moisture, air, and the like can be present.

The encapsulation layer ENCAP can be a single layer, or two or more layers can be laminated. In addition, the encapsulation layer ENCAP can be a metal layer, or two or more organic and inorganic layers can be laminated.

FIG. 14 illustrates a case in which the encapsulation layer ENCAP is formed by laminating a first encapsulation layer PAS1, a second encapsulation layer PCL, and a third encapsulation layer PAS2. Here, the first encapsulation layer PAS1 can be a first inorganic layer, the second encapsulation layer PCL can be an organic layer, and the third encapsulation layer PAS2 can be a second inorganic layer. The plurality of sensing touch lines TLs can be arranged on a side surface of the encapsulation layer ENCAP.

On the other hand, a dam (DAM) can exist at the outside of the panel.

The dam (DAM) can be formed at or near one or more boundary points of the first, second, and third encapsulation layers PAS1, PCL, and PAS2. This dam (DAM) can be formed high by stacking the bank BK and the encapsulation layer ENCAP.

This dam (DAM) is capable of preventing the encapsulation layer ENCAP from collapsing to the side of the panel.

In addition, since the encapsulation layer ENCAP partially extends in the dam (DAM), the dam (DAM) is capable of performing a sealing function, thereby protecting the pixels and the like from moisture and the like flowing into the inside of the panel from the side.

On the other hand, a touch buffer layer T-BUF is arranged on the encapsulation layer ENCAP. The touch buffer layer T-BUF can be arranged between the encapsulation layer ENCAP and the plurality of sensing touch lines TLs. A bridge electrode is arranged on the touch buffer layer T-BUF.

A touch insulation layer ILD is arranged on the touch buffer layer T-BUF. The touch insulation layer ILD is arranged between the bridge electrode BP and the touch electrodes TEd and TEs.

On the touch insulation layer ILD, touch electrodes TEd and TEs are formed and touch lines TLd and TLs connecting the touch electrodes TEd and TEs to two touch pads TPd and TPs are formed.

The touch lines TLd and TLs and the touch electrodes TEd and TEs can be formed on different layers or on the same layer.

Each of the touch electrodes TEd and TEs is an example of a mesh type having a plurality of open areas OA.

FIG. 14 is a cross-sectional view taken along line A-A' of FIG. 13, illustrating a sensing touch electrode line STEL, a sensing touch line TLs connected to the sensing touch electrode line STEL, and a sensing touch pad TPs connected to the sensing touch line TLs. Thus, the touch electrode and the touch line arranged on the touch insulation layer ILD correspond to the sensing touch electrode TEs and the sensing touch line TLs, and the touch pad connected to the sensing touch line TLs also corresponds to a sensing touch pad TPs.

Referring to FIG. 14, the sensing touch pad TPs can have an upper touch pad electrode and a lower touch pad electrode. The lower touch pad electrode can be formed in the same layer as the source electrode or the drain electrode. The upper touch pad electrode can be formed in the same layer as the plurality of touch driving electrodes TEd.

A touch pad contact hole can be formed through the touch insulation layer ILD and the touch buffer layer T-BUF. The lower touch pad electrode can be connected to the upper touch pad electrode in the touch pad contact hole.

Referring to FIG. 14, the sensing touch line TLs is connected to the sensing touch electrodes TEs and extends from the non-active area N/A to the area outside the dam beyond the area where the dam (DAM) exists.

As illustrated in FIG. 14, a part of the sensing touch line TLs extending to the area outside the dam can serve as a sensing touch pad TPs, and in some cases, can come into contact with an electrode pattern formed in the source-drain layer so as to serve as a sensing touch pad TPs together with the electrode pattern.

In addition, a part of the sensing touch line TLs extending to the area outside the dam is connected to the electrode pattern formed on the source-drain layer, and the electrode pattern can serve as a sensing touch pad TPs.

Meanwhile, the encapsulation layer ENCAP can be formed to have a predetermined thickness. Here, the thickness of the encapsulation layer ENCAP can be designed in consideration of RC delay and influence on touch performance (touch sensitivity) at the time of touch driving and touch sensing.

Referring to FIGS. 13 and 14, since the sensing touch electrode TEs is formed on the encapsulation layer ENCAP, the sensing touch lines TLs, which connect the sensing touch electrodes TEs and the sensing touch pads TPs, have no option but to pass over the data lines DL or the data link lines DLL connected to the data lines DL.

Referring to FIGS. 13 and 14, in the active area A/A, a second electrode E2 exists between the sensing touch electrodes TEs and the data lines DL. The second electrode E2 is also present between the driving touch electrodes TEd and the data lines DL.

In addition, even in a part of an outer area of the active area A/A, the second electrode E2 is present between the sensing touch lines TLs and the data link lines DLL.

As described above, when the second electrode E2 is present between the data lines DL and the data link lines DLL and between the sensing touch electrodes TEs and the sensing touch line TLs, it is possible to prevent (shield) noise, which is generated from the data lines DL, from flowing into the sensing touch electrodes TEs and the sensing touch lines TLs. For example, the noise generated in the data lines DL can be generated according to a change in data voltage applied to the data lines DL.

However, since a second electrode E2 corresponding to a common electrode does not exist when the sensing touch lines TLd become closer to the sensing touch pad TPs (i.e. in the non-active area N/A outside of the cathode area C/A), the noise generated in the data lines DL (also referred to as data noise) cannot be shielded.

As the noise generated in the data lines DL flows into the sensing touch lines TLs or the sensing touch pads TPs as described above, the signal-to-noise ratio SNR of a sensing signal received by the touch driving circuit TDC can be reduced and the touch sensitivity can also be significantly lowered.

Accordingly, the display panel DISP of the touch display device according to the embodiments of the present disclosure can have a second touch sensor structure resistant to data noise. This will be described with reference to FIGS. 15 to 18.

Figure 15:
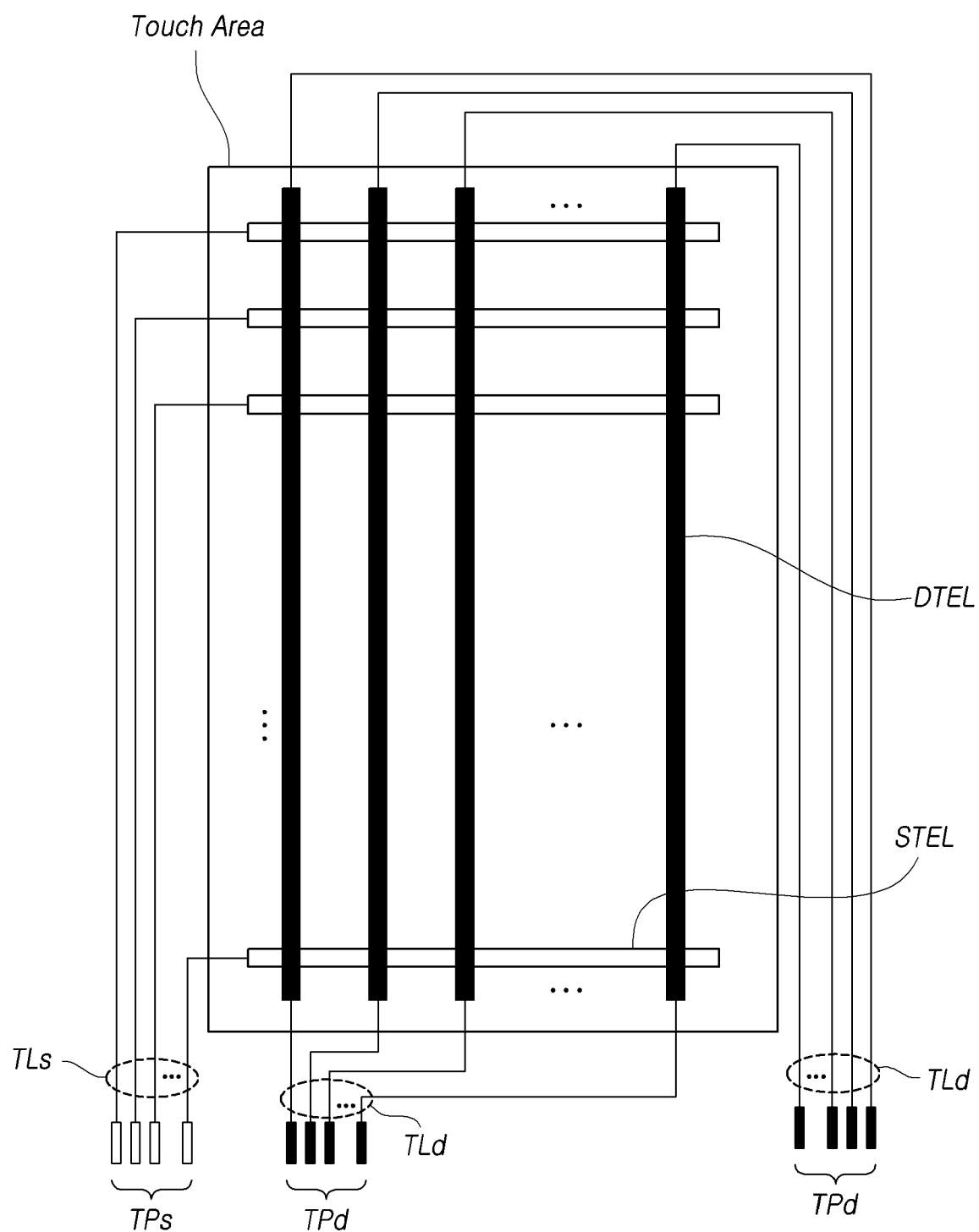
FIG. 15 is a diagram illustrating a second touch sensor structure of the display panel according to the embodiments of the present disclosure.
Figure 16:
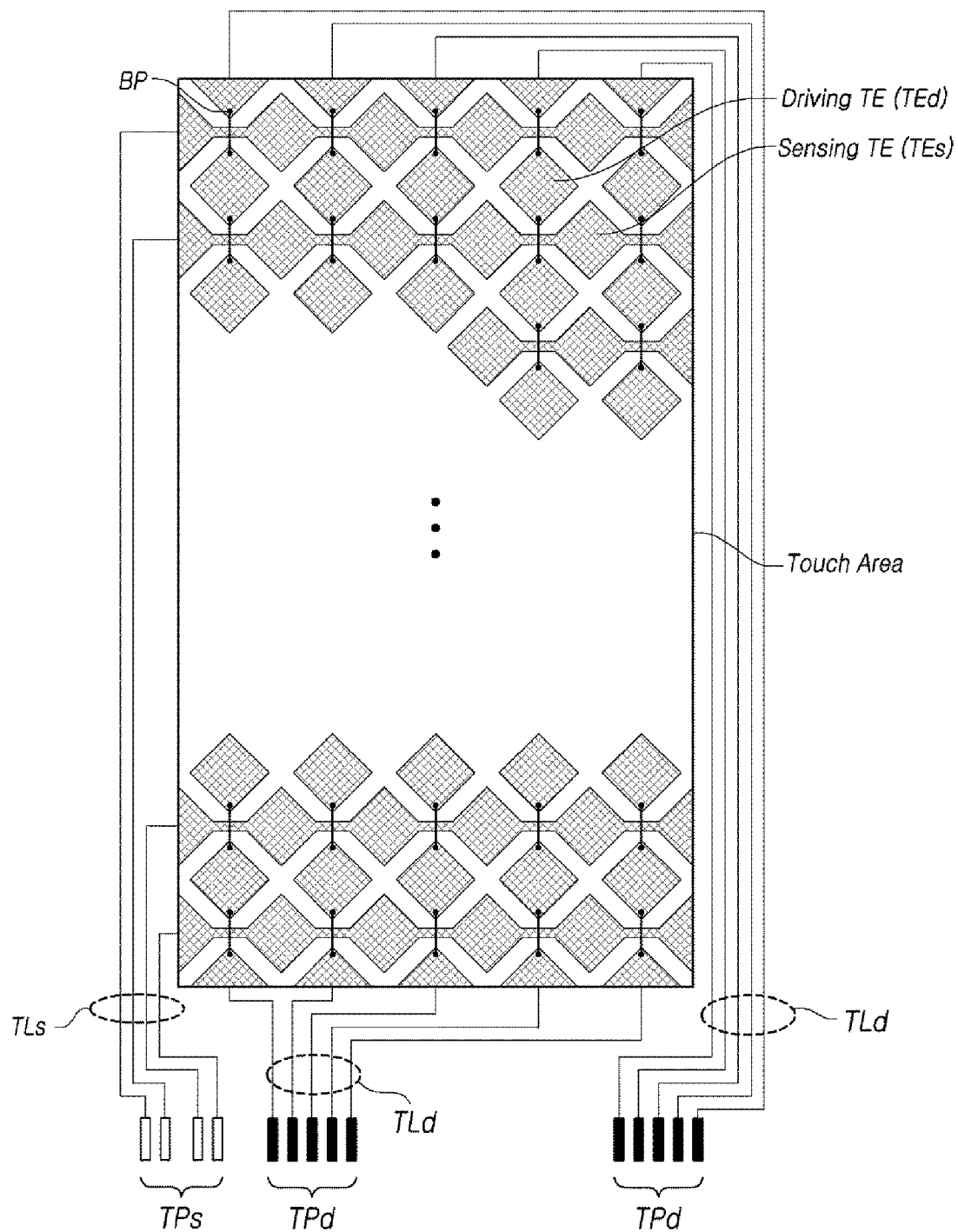
FIG. 16 is a diagram illustrating an example of the second touch sensor structure of the display panel according to the embodiments of the present disclosure.
Figure 17:
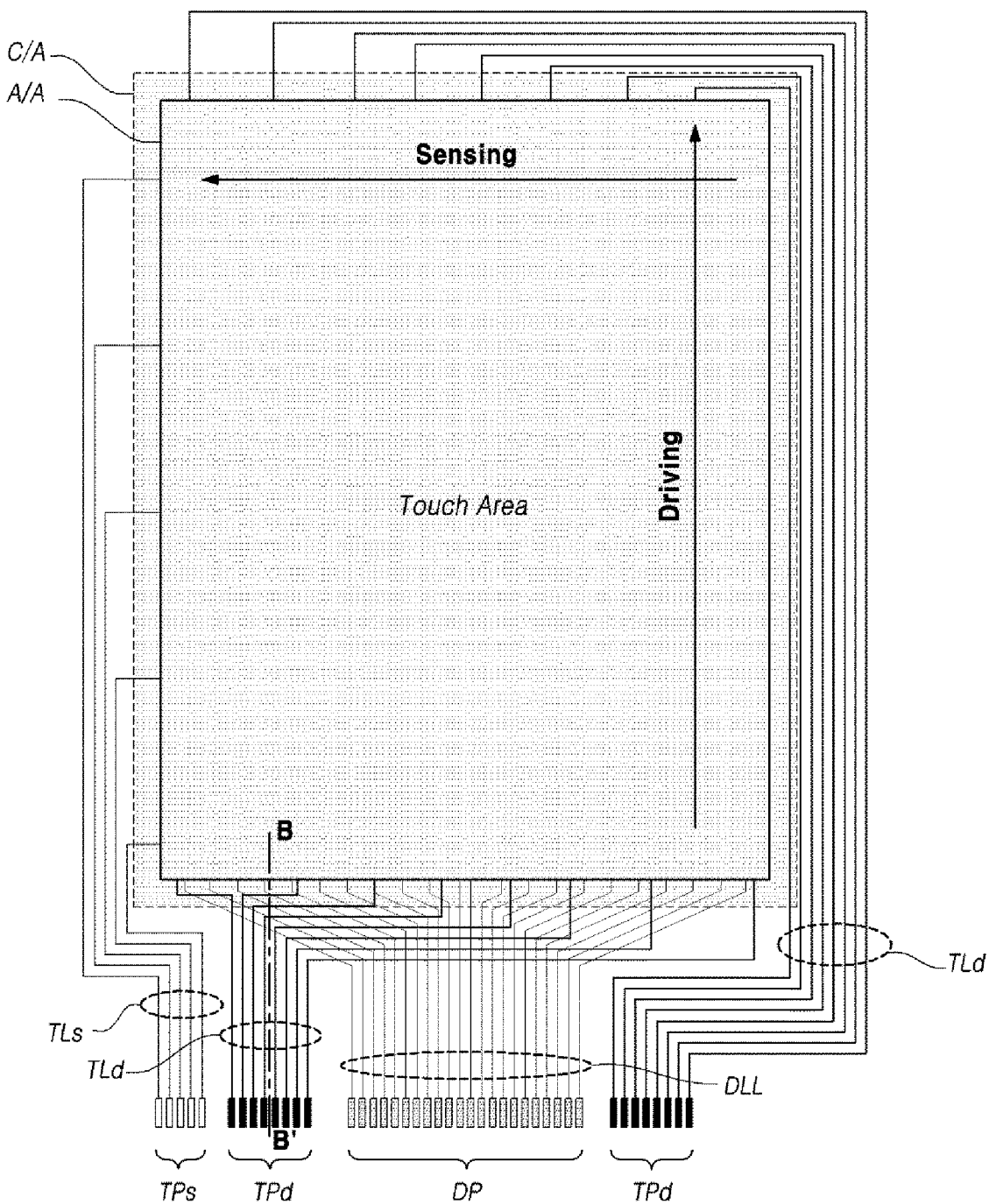
FIG. 17 is a diagram illustrating a structure in which driving touch lines, sensing touch lines, and data link lines are disposed in a non-active area N/A according to the second touch sensor structure of the display panel according to the embodiments of the present disclosure.
Figure 18:
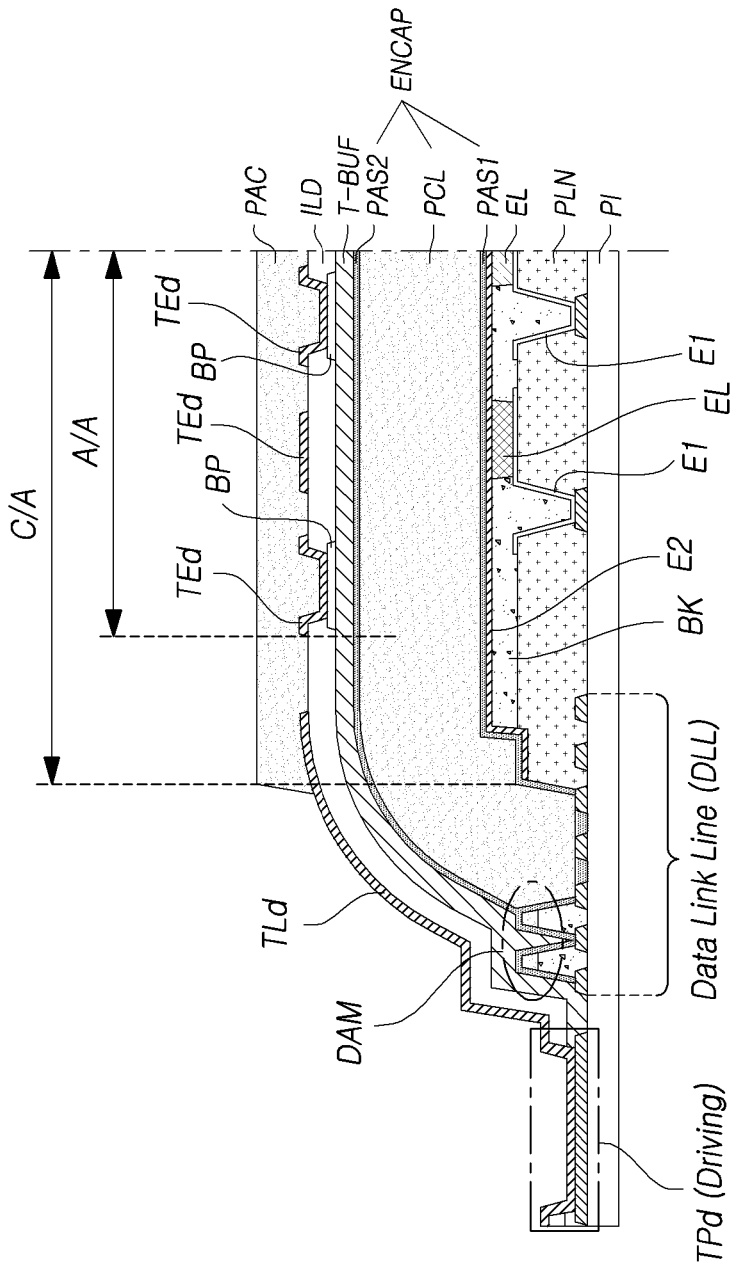
FIG. 18 is a cross-sectional view of a portion B-B' of FIG. 17.

FIG. 15 is a diagram illustrating a second touch sensor structure of the display panel DISP according to the embodiments of the present disclosure, and FIG. 16 is a diagram illustrating an example of the second touch sensor structure of the display panel DISP according to the embodiments of the present disclosure. FIG. 17 is a diagram illustrating a structure in which driving touch lines TLd, sensing touch lines TLs, and data link lines DLL are disposed in a non-active area N/A according to the second touch sensor structure of the display panel DISP according to the embodiments of the present disclosure. FIG. 18 is a cross-sectional view of a portion B-B' of FIG. 17.

Referring to FIGS. 15 to 17, in order to drive the touch panel TSP, each of the plurality of driving touch electrode lines DTEL is electrically connected to at least one driving touch line TLd. Each driving touch line TLd is electrically connected to the touch driving circuit TDC via a driving touch pad TPd.

Referring to FIGS. 15 to 17, in order to sense the touch panel TSP, each of the plurality of sensing touch electrode lines STEL is electrically connected to one or more sensing touch lines TLs. Each sensing touch line TLd is electrically connected to the touch driving circuit TDC via a sensing touch pad TPs.

Referring to FIGS. 15 to 17, a line arrangement structure for each area of the display panel DISP will be described below.

A plurality of data lines DL and a plurality of gate lines GL are arranged in the active area A/A of the display panel DISP.

A plurality of driving touch electrode lines DTEL and a plurality of sensing touch electrode lines STEL are arranged in the active area A/A of the display panel DISP.

In the non-active area N/A, which is an area outside the active area A/A of the display panel DISP, a plurality of data lines DL extend or a plurality of data link lines DLL connected to the plurality of data lines DL are arranged, a plurality of driving touch lines TLd connected to the plurality of driving touch electrode lines DTEL are arranged, and a plurality of sensing touch lines TLs connected to the plurality of sensing touch electrode lines STEL are arranged.

According to the second touch sensor structure of the display panel DISP, in the active area A/A corresponding to the touch area of the display panel DISP, a plurality of driving touch electrode lines DTEL can be disposed in the same direction as the plurality of data lines DL and a plurality of sensing touch electrode lines STEL can be disposed in the same direction as the plurality of gate lines GL.

According to the second touch sensor structure of the display panel DISP, in the non-active area N/A which is an outer area of the active area A/A of the display panel DISP, the plurality of data lines DL can extend or a plurality of data link lines DLL connected to the plurality of data lines DL can be disposed, the plurality of driving touch lines TLd connected to the plurality of driving touch electrode lines DTEL can be disposed, and the plurality of sensing touch lines TLs connected to the plurality of sensing touch electrode lines STEL can be disposed.

Referring to FIG. 17, a cathode formation area C/A can have a size which is substantially equal to or larger than that of the active area A/A.

Meanwhile, referring to FIGS. 17 and 18, according to the second touch sensor structure of the display panel DISP, in the non-active area of the display panel DISP, none of the plurality of sensing touch lines TLs overlaps any of the plurality of data link lines DLL.

Accordingly, it is possible to prevent the noise generated in the data line DL from flowing into the sensing touch lines TLs or the sensing touch pads TPs, thereby preventing the lowering of touch sensitivity due to data noise.

Referring to FIGS. 17 and 18, in the case of the second touch sensor structure of the display panel DISP, compared to the first touch sensor structure, the positions and directions of the driving touch electrode lines DTEL and the sensing touch electrode lines STEL are changed.

Thus, in the case of the second touch sensor structure of the display panel DISP, the positions of the driving touch lines TLd and the sensing touch lines TLs are also changed, and the positions of the driving touch pads TPd and the sensing touch pads TPs are also changed.

In such a second touch sensor structure, in the non-active area N/A of the display panel DISP, at least one of the plurality of data link lines DLL can overlap at least one of the plurality of driving touch lines TLd.

Thus, according to the second touch sensor structure, since the positions of the driving touch lines TLd are changed to the positions where the driving touch lines TLd overlap the data link lines DLL, it is possible to prevent a phenomenon in which the noise generated in the data lines DL flows into the sensing touch lines TLs or the sensing touch pads TPs or the like, through which it is possible to prevent the lowering of touch sensitivity.

Of course, even though the noise generated in the data line DL can flow into the driving touch lines TLd or the driving touch pads TPd, the noise does not greatly affect the touch sensitivity.

Referring to FIG. 18, a polyimide layer PI is arranged on a substrate or a back plate.

A source-drain layer can be present on the polyimide layer PI. In the source-drain layer, various signal lines such as a data line DL, source/drain electrodes of various transistors, and the like can be formed in the active area A/A.

In addition, in the source-drain layer, a data link line DLL, a touch pad (e.g., TPs), and the like can be formed in the non-active area N/A. In particular, as is discussed below, a lower touch pad electrode can be formed in the source-drain layer.

A planarization layer PLN can be arranged on the source-drain layer.

On the planarization layer PLN, a first electrode E1 is located at the light-emitting position of each sub-pixel, and a bank BK is arranged on the first electrode E1.

An organic light-emitting layer EL is arranged on the first electrode E1 between adjacent two banks BK.

A second electrode E2 can be arranged on the organic light-emitting layer EL. Here, the second electrode E2 can be a common electrode formed in common to all sub-pixel areas.

On the second electrode E2, an encapsulation layer ENCAP for preventing penetration of moisture, air, and the like can be present.

The encapsulation layer ENCAP can be a single layer, or two or more layers can be laminated. In addition, the encapsulation layer ENCAP can be a metal layer, or two or more organic and inorganic layers can be laminated.

FIG. 18 illustrates a case in which the encapsulation layer ENCAP is formed by laminating a first encapsulation layer PAS1, a second encapsulation layer PCL, and a third encapsulation layer PAS2. Here, the first encapsulation layer PAS1 can be a first inorganic layer, the second encapsulation layer PCL can be an organic layer, and the third encapsulation layer PAS2 can be a second inorganic layer. The plurality of driving touch lines TLd can be arranged on a side surface of the encapsulation layer ENCAP.

On the other hand, a dam (DAM) can exist at the outside of the panel.

The dam (DAM) can be formed at or near one or more boundary points of the first, second, and third encapsulation layers PAS1, PCL, and PAS2. This dam (DAM) can be formed high by stacking the bank BK and the encapsulation layer ENCAP.

This dam (DAM) is capable of preventing the encapsulation layer ENCAP from collapsing to the outline of the panel.

In addition, since the encapsulation layer ENCAP partially extends in the dam (DAM), the dam (DAM) is capable of performing a sealing function, thereby protecting the pixels and the like from moisture and the like flowing into the inside of the panel from the side.

On the other hand, a touch buffer layer T-BUF is arranged on the encapsulation layer ENCAP. The touch buffer layer T-BUF can be arranged between the encapsulation layer ENCAP and the plurality of sensing touch lines TLs. A A bridge electrode is arranged on the touch buffer layer T-BUF.

A touch insulation layer ILD is arranged on the touch buffer layer T-BUF. The touch insulation layer ILD is arranged between the bridge electrode BP and the touch electrodes TEd and TEs.

On the touch insulation layer ILD, touch electrodes TEd and TEs are formed and touch lines TLd and TLs connecting the touch electrodes TEd and TEs to two touch pads TPd and TPs are formed.

The touch lines TLd and TLs and the touch electrodes TEd and TEs can be formed on different layers or on the same layer.

Each of the touch electrodes TEd and TEs is an example of a mesh type having an plurality of open areas OA.

FIG. 18 is a cross-sectional view taken along line B-B' of FIG. 17, illustrating an area where a driving touch electrode line DTEL, a driving touch line TLs connected to the driving touch electrode line DTEL, and a driving touch pad TPd connected to the driving touch line TLd are present. Thus, the touch electrode and the touch line arranged on the touch insulation layer ILD correspond to the driving touch electrode TEd and the driving touch line TLd, and the touch pad connected to the driving touch line TLd also corresponds to a driving touch pad TPd.

Referring to FIG. 18, the driving touch pad TPd can have an upper touch pad electrode and a lower touch pad electrode. The lower touch pad electrode can be formed in the same layer as the source electrode or the drain electrode. The upper touch pad electrode can be formed in the same layer as the plurality of touch driving electrodes TEd.

A touch pad contact hole can be formed through the touch insulation layer ILD and the touch buffer layer T-BUF. The lower touch pad electrode can be connected to the upper touch pad electrode in the touch pad contact hole.

Referring to FIG. 18, the driving touch line TLd is connected to the driving touch electrodes TEd and extends from the non-active area N/A to an area outside the dam beyond the area where the dam (DAM) exists.

As illustrated in FIG. 18, a part of the driving touch line TLd extending to the area outside the dam can serve as a driving touch pad TPd, and in some cases, can come into contact with an electrode pattern formed in the source-drain layer so as to serve as a driving touch pad TPd together with the electrode pattern.

In addition, a part of the driving touch line TLd extending to the area outside the dam is connected to the electrode pattern formed on the source-drain layer, and the electrode pattern can serve as a driving touch pad TPd.

Meanwhile, the encapsulation layer ENCAP can be formed to have a predetermined thickness. Here, the thickness of the encapsulation layer ENCAP can be designed in consideration of RC delay and influence on touch performance (touch sensitivity) at the time of touch driving and touch sensing.

Referring to FIGS. 17 and 18, according to the second touch sensor structure of the display panel DISP of the touch display device according to the embodiments of the present disclosure, sensing touch lines TLs and data link lines DLL do not overlap each other in an area where the second electrode E2 corresponding to the common electrode does not exist (i.e., the outer area of the cathode formation area C/A).

Accordingly, it is possible to prevent the noise, which is generated in the data line DL, from flowing into the sensing touch lines TLs, the sensing touch pads TPs, and the like.

Referring to FIG. 18, according to the second touch sensor structure, the non-active area N/A of the display panel DISP can include an area where the common electrode E2 is formed (the area inside the cathode formation area C/A). In other words, the plurality of driving touch lines TLd can overlap a portion of the common electrode E2. Similarly, the plurality of sensing touch lines TLs can overlap a different portion of the common electrode E2.

The non-active area N/A of the display panel DISP can include an area where a common electrode (e.g., the second electrode E2) does not exist between at least one of the plurality of driving touch lines TLd and at least one of the plurality of data link lines DLL.

As described above, in the non-active area N/A of the display panel DISP, since the common electrode (e.g., the second electrode E2) does not exist between at least one of the plurality of driving touch lines TLd and at least one of the plurality of data link lines DLL, the noise generated in the data line DL can flow into the driving touch lines TLd.

As described above, as illustrated in FIGS. 15 to 17, according to the second touch sensor structure, a plurality of driving touch electrode lines DTEL can be arranged parallel to a plurality of data lines DL, and a plurality of sensing touch electrode lines STEL can be arranged parallel to the plurality of gate lines GL.

According to such a structure, a plurality of driving touch lines TLd connected to a plurality of driving touch electrode lines DTEL can be located in the area where a plurality of data link lines DLL is formed in the non-active area N/A.

Referring to FIGS. 15 and 16, each of the plurality of driving touch electrode lines DTEL can be formed of a plurality of driving touch electrodes TEd, which are integrated or electrically connected to each other. In addition, each of the plurality of sensing touch electrode lines STEL can be formed of a plurality of sensing touch electrodes TEs, which are integrated or electrically connected to each other.

Referring to FIGS. 15 and 16, one end of each of the plurality of driving touch electrode lines DTEL is connected to the driving touch line TLd, or both ends of each of the plurality of driving touch electrode lines DTEL are connected to the driving touch lines TLd. One end of each of the plurality of sensing touch electrode lines STEL can be connected to the sensing touch lines TLs or both ends of each of the plurality of sensing touch electrode lines STEL can be connected to the sensing touch lines TLs.

According to the above description, it is possible to make various touch sensor structures for mutual capacitance-based touch sensing. For example, when one driving touch line is connected to one driving touch electrode line, it is possible to reduce the size of a driving touch line formation space. In comparison with this, when two driving touch lines TLd are connected to one driving touch electrode line, it is possible to stably supply a driving signal to one driving touch electrode line. For example, when one sensing touch line is connected to one sensing touch electrode line, it is possible to reduce the size of a sensing touch line formation space. In comparison with this, when two driving touch lines TLd are connected to one sensing touch electrode line, a sensing signal can be stably detected from the one sensing touch electrode line.

Referring to FIGS. 15 to 17, in a non-active area N/A of the display panel DISP, a plurality of data pads DP, which electrically connect a plurality of data link lines DLL and a data driving circuit DDC, are arranged. For example, each of the plurality of data pads DP is electrically connected to a corresponding one of the plurality of data link lines DLL.

Referring to FIGS. 15 to 17, in the non-active area N/A of the display panel DISP, a plurality of driving touch pads TPd, which electrically connect the plurality of driving touch lines TLd to the touch sensing circuit TSC, are disposed and a plurality of sensing touch pads TPs, which electrically connect a plurality of sensing touch lines TLs to the touch sensing circuit TSC, are disposed. For example, each of the plurality of sensing touch pads TPs is electrically connected to a corresponding one of the plurality of sensing touch lines TLs. Similarly, each of the plurality of driving touch pads TPd is electrically connected to a corresponding one of the plurality of driving touch lines TLd. The plurality of driving touch pads TPd are disposed adjacent to the plurality of data pads DP in comparison with the plurality of sensing touch pads TPs. That is to say, the plurality of driving touch pads TPd are arranged closer to the plurality of data pads DP than the plurality of sensing touch pads TPs are arranged to the plurality of data pads DP.

According to the above description, it is possible to provide a pad structure capable of protecting the plurality of sensing touch lines TLs from data noise.

Referring to FIG. 18, a plurality of pixel electrodes E1 can be disposed in the active area A/A of the display panel DISP, a common electrode E2 can be disposed on the plurality of pixel electrodes E1, and an encapsulation layer ENCAP can be disposed on the common electrode E2.

A plurality of driving touch electrode lines DTEL and a plurality of sensing touch electrode lines STEL corresponding to a plurality of touch electrodes TE can be arranged on the sealing layer ENCAP.

As described above, by forming the touch electrodes TE on the encapsulation layer ENCAP, the touch electrodes TE can be formed without greatly affecting the display performance and the formation of a related layer.

In the active area A/A of the display panel DISP, the common electrode E2 can be positioned between the plurality of driving touch electrode lines DTEL and the plurality of data lines DL.

In the active area A/A of the display panel DISP, the common electrode E2 can be positioned between the plurality of sensing touch electrode lines STEL and the plurality of data lines DL.

The noise generated in the data lines DL can be prevented (shielded) from flowing into the plurality of sensing touch electrode lines STEL and the plurality of driving touch electrode lines DTEL in the active area A/A.

Referring to FIG. 18, the non-active area N/A of the display panel DISP can include an area where the common electrode E2 is formed (the area inside the cathode formation area C/A). In other words, the plurality of driving touch lines TLd can overlap a portion of the common electrode E2. Similarly, the plurality of sensing touch lines TLs can overlap a different portion of the common electrode E2.

The non-active area N/A of the display panel DISP can include an area where the common electrode E2 is not formed (the area outside the cathode formation area C/A).

Referring to FIG. 18, in the area where the common electrode E2 is not formed, at least one of the plurality of data link lines DLL can overlap at least one of the plurality of driving touch lines TLd.

The non-active area N/A of the display panel DISP can include an area where the common electrode E2 is not formed.

In the area where the common electrode is not formed, none of the plurality of sensing touch lines TLs can overlap any of a plurality of data link lines DLL.

Figure 19:
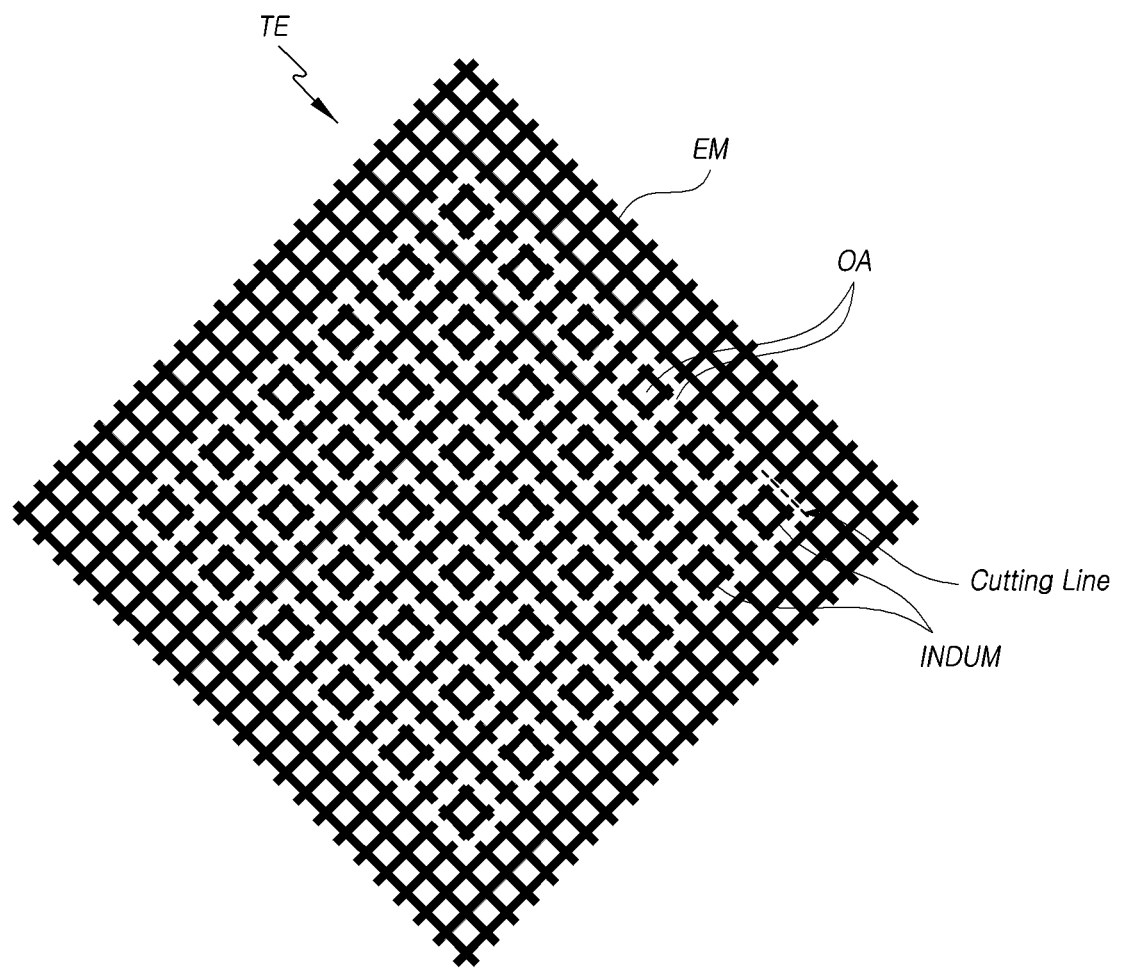
FIGS. 19 to 21 are diagrams each illustrating the case where an internal dummy metal is present in a mesh-type touch electrode area in the display panel according to the embodiments of the present disclosure.
Figure 20:
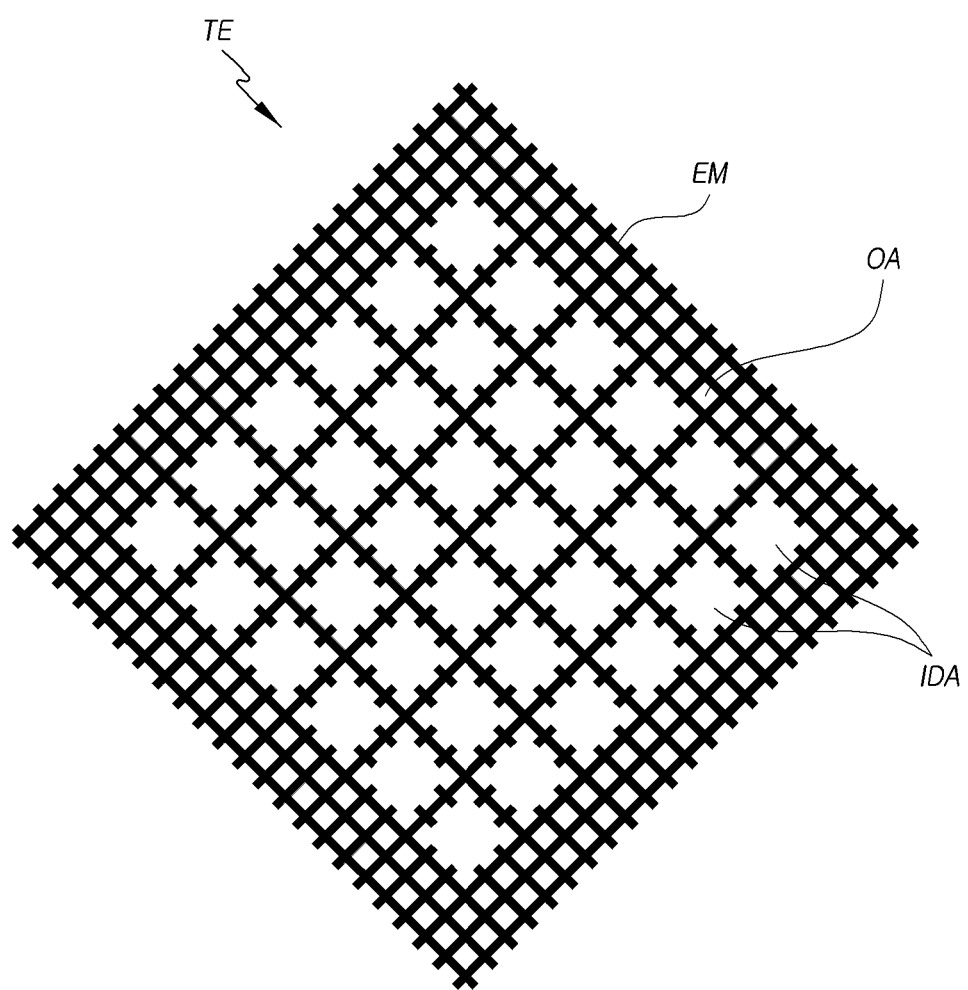
Figure 21:
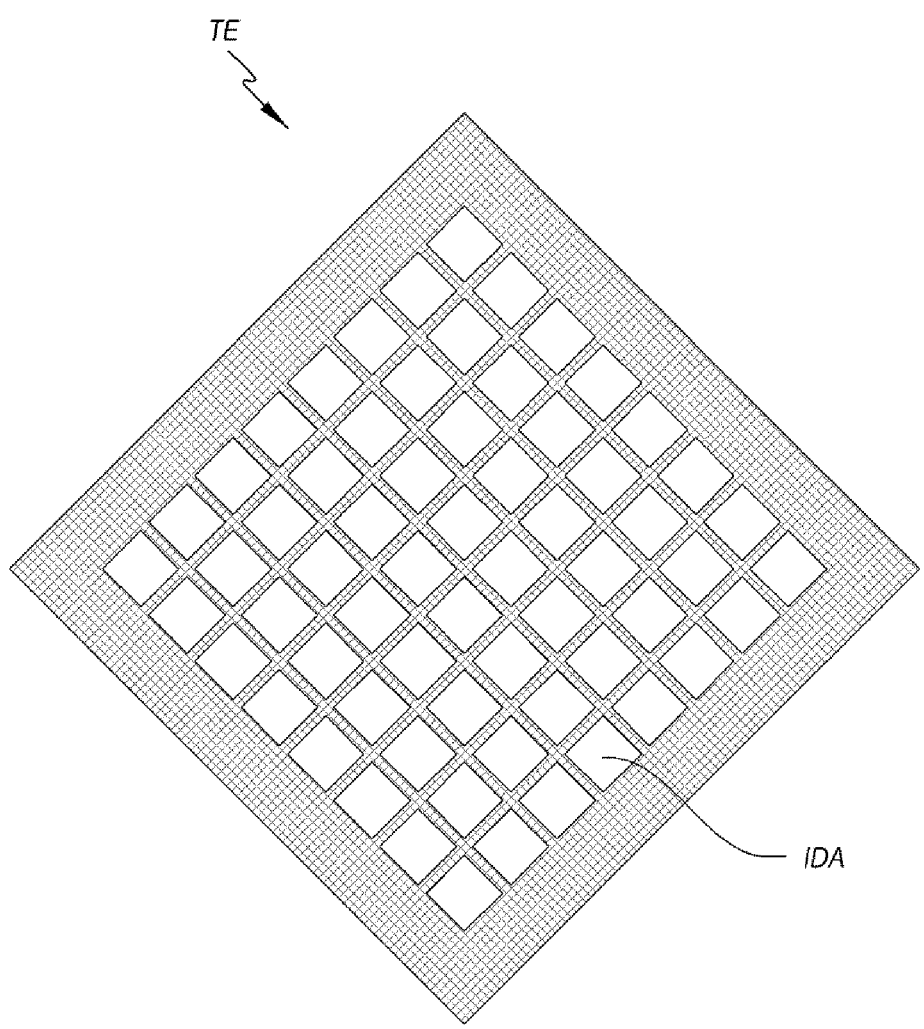

FIGS. 19 to 21 are diagrams each illustrating the case where an internal dummy metal is present in a mesh-type touch electrode TE area in the display panel according to the embodiments of the present disclosure.

Referring to FIGS. 19 to 21, in the area of all or some of the plurality of touch electrodes TE disposed on the touch panel TSP, an electrode metal EM patterned in a mesh type and at least one broken internal dummy metal INDUM can be disposed.

Meanwhile, when the at least one internal dummy metal INDUM does not exist in the area of one touch electrode TE and only the electrode metal EM exists in the mesh type, a visibility problem can arise which causes the outline of the electrode metal EM to be visible on a screen. However, by forming the internal dummy metal INDUM in the touch electrode area in the present disclosure, it is possible to prevent the visibility problem that can arise when one touch electrode TE is patterned in the form of a mesh.

The electrode metal EM is patterned in the form of a mesh, and then the electrode metal EM patterned in the form of a mesh is cut in order to form a touch electrode (a cutting process for touch electrode formation).

Thereafter, the electrode metal EM patterned in the form of a mesh in one touch electrode area is cut into a predetermined pattern (a cutting process for internal dummy metal formation) so as to form an internal dummy metal INDUM which is broken from the electrode metal EM.

When the internal dummy metal INDUM is formed as described above, the internal dummy metal INDUM is a portion broken from the electrode metal EM by the cutting process.

Accordingly, at least one internal dummy metal INDUM in the touch electrode area can be disposed in the same layer as the electrode metal EM corresponding to each of the plurality of touch electrodes TE and can be made of the same material as the electrode metal EM.

According to the method of forming the internal dummy metal INDUM described above, there is an advantage in that the internal dummy metal INDUM can be formed more easily and the electrode metal EM and the dummy metal DM can be formed in a single layer.

FIG. 20 is a diagram illustrating an electrode metal EM corresponding to a touch electrode TE in which the internal dummy metal INDUM is omitted in FIG. 19, and FIG. 15 is a diagram illustrating FIG. 14 in a simplified form.

Referring to FIGS. 20 and 21, it can be seen that the size of the electrode metal to which a driving signal is applied or from which a sensing signal is received in one touch electrode TE is reduced by the space IDA occupied by the internal dummy metal INDUM.

According to the embodiments of the present disclosure described above, it is possible to provide a touch display device and a display panel DISP having a touch sensor structure resistant to noise of display driving electrodes/lines of data lines DL or the like.

According to the embodiments of the present disclosure, it is possible to provide a touch display device and a display panel DISP having a structure that, even when the noise of display driving electrodes/lines of the data lines DL or the like occurs, enables sensing touch lines TLs not to be affected by the noise.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A display device comprising:
    an active area and a non-active area;
    a plurality of data lines arranged in the active area;
    a plurality of data link lines connected to the plurality of data lines;
    an encapsulation layer having at least one organic layer and at least one inorganic layer;
    a touch sensor having a plurality of driving touch electrodes and a plurality of sensing touch electrodes arranged on the encapsulation layer;
    a plurality of driving touch lines arranged on a side surface of the encapsulation layer and applying driving signals to the plurality of driving touch electrodes; and
    a plurality of sensing touch lines connected to the plurality of sensing touch electrodes and receiving sensing signals from the plurality of sensing touch electrodes, wherein a dam is formed in the non-active area to prevent the encapsulation layer from collapsing, and at least one of the plurality of data link lines overlaps at least one of the plurality of driving touch lines and the dam in the non-active area, wherein in the non-active area, none of the plurality of sensing touch lines overlaps any of the plurality of data link lines, wherein the plurality of driving touch electrodes are arranged in a same direction as the plurality of data lines, wherein a plurality of data pads are arranged to electrically connect the plurality of data link lines, wherein a plurality of driving touch pads are arranged to electrically connect the plurality of driving touch lines, and a first group and a second group of the plurality of driving touch pads are arranged at both outer sides of the plurality of data pads, wherein a plurality of sensing touch pads are arranged to electrically connect the plurality of sensing touch lines, and are arranged at an outer side of the first group or the second group of the plurality of driving touch pads, and wherein each outer side is a side facing a direction parallel to an adjacent side of the active area and away from a center axis of the display device.

2. The display device of claim 1, further comprising a touch buffer layer arranged on the encapsulation layer.

3. The display device of claim 2, wherein the touch buffer layer is arranged between the encapsulation layer and the plurality of driving touch lines or the plurality of sensing touch lines.

4. The display device of claim 2, further comprising a touch insulation layer arranged on the touch buffer layer.

5. The display device of claim 4, further comprising a bridge electrode arranged on the touch buffer layer.

6. The display device of claim 5, wherein the touch insulation layer is arranged between the bridge electrode and the touch sensor.

7. The display device of claim 5, wherein the bridge electrode or the touch sensor is in the form of a mesh, the mesh comprising a plurality of open areas.

8. The display device of claim 7, further comprising an anode electrode, a cathode electrode, and a light emitting layer arranged between the anode electrode and the cathode electrode.

9. The display device of claim 8, further comprising a bank on the anode electrode, the bank defining a plurality of pixel areas.

10. The display device of claim 9, wherein each of the plurality of open areas overlaps a corresponding one of the plurality of pixel areas.

11. The display device of claim 1, wherein in the active area, the plurality of driving touch lines are arranged parallel to the plurality of data lines, and the plurality of sensing touch lines are arranged parallel to a plurality of gate lines.

12. The display device of claim 1, further comprising a thin-film-transistor having a gate electrode, a semiconductor layer, a source electrode, and a drain electrode.

13. The display device of claim 12, wherein the plurality of driving touch pads or sensing touch pads include a lower touch pad electrode and an upper touch pad electrode.

14. The display device of claim 13, wherein the lower touch pad electrode is formed in the same layer as the source electrode or the drain electrode.

15. The display device of claim 14, wherein the upper touch pad electrode is formed in the same layer as the plurality of driving touch electrodes or the plurality of sensing touch electrodes.

16. The display device of claim 15, further comprising a touch pad contact hole formed through the touch insulation layer and the touch buffer layer, wherein the lower touch pad electrode is connected to the upper touch pad electrode in the touch pad contact hole.

17. A display device comprising:

an active area and a non-active area;

an anode electrode, a cathode electrode, and a light emitting layer arranged between the anode electrode and the cathode electrode;

a plurality of data lines arranged in the active area;

a plurality of data link lines connected to the plurality of data lines;

an encapsulation layer arranged on the cathode electrode and having at least one organic layer and at least one inorganic layer;

a touch sensor having a plurality of driving touch electrodes and a plurality of sensing touch electrodes arranged on the encapsulation layer;

a plurality of driving touch lines arranged on a side surface of the encapsulation layer and applying driving signals to the plurality of driving touch electrodes, wherein the plurality of driving touch lines overlap a first portion of the cathode electrode in the non-active area; and a plurality of sensing touch lines connected to the plurality of sensing touch electrodes and receiving sensing signals from the plurality of sensing touch electrodes, wherein the plurality of sensing touch lines overlap a second portion of the cathode electrode in the non-active area, wherein a dam is formed in the non-active area to prevent the encapsulation layer from collapsing, and at least one of the plurality of data link lines overlaps at least one of the plurality of driving touch lines and the dam in the non-active area, wherein in the non-active area, none of the plurality of sensing touch lines overlaps any of the plurality of data link lines, wherein the plurality of driving touch electrodes are arranged in a same direction as the plurality of the data lines, wherein a plurality of data pads are arranged to electrically connect the plurality of data link lines, wherein a plurality of driving touch pads are arranged to electrically connect the plurality of driving touch lines, and a first group and a second group of the plurality of driving touch pads are arranged at both outer sides of the plurality of data pads, wherein a plurality of sensing touch pads are arranged to electrically connect the plurality of sensing touch lines, and are arranged at an outer side of the first group or the second group of the plurality of driving touch pads, and wherein each outer side is a side facing a direction parallel to an adjacent side of the active area and away from a center axis of the display device.

18. The display device of claim 17, further comprising a touch buffer layer arranged on the encapsulation layer.

19. The display device of claim 18, wherein the touch buffer layer is arranged between the encapsulation layer and the plurality of driving touch lines or the plurality of sensing touch lines.

20. The display device of claim 18, further comprising a touch insulation layer arranged on the touch buffer layer.

21. The display device of claim 20, further comprising a bridge electrode arranged on the touch buffer layer.

22. The display device of claim 21, wherein the touch insulation layer is arranged between the bridge electrode and the touch sensor.

23. The display device of claim 21, wherein the bridge electrode or the touch sensor is in the form of a mesh, the mesh comprising a plurality of open areas.

24. The display device of claim 23, further comprising a bank arranged on the anode electrode, the bank defining a plurality of pixel areas.

25. The display device of claim 24, wherein each of the plurality of open areas overlaps a corresponding one of the plurality of pixel areas.

26. The display device of claim 17, wherein in the active area, the plurality of driving touch lines are arranged parallel to the plurality of data lines, and the plurality of sensing touch lines are arranged parallel to a plurality of gate lines.

27. The display device of claim 17, further comprising a thin-film-transistor having a gate electrode, a semi-conductor layer, a source electrode, and a drain electrode.

28. The display device of claim 27, wherein the plurality of driving touch pads or sensing touch pads include a lower touch pad electrode and an upper touch pad electrode.

29. The display device of claim 28, wherein the lower touch pad electrode is formed in the same layer as the source electrode or the drain electrode.

30. The display device of claim 29, wherein the upper touch pad electrode is formed in the same layer as the plurality of driving touch electrodes or the plurality of sensing touch electrodes.

31. The display device of claim 30, further comprising a touch pad contact hole formed through the touch insulation layer and the touch buffer layer,
wherein the lower touch pad electrode is connected to the upper touch pad electrode in the touch pad contact hole.

\* \* \* \* \*